United States Patent
Snyder et al.

(10) Patent No.: US 11,362,536 B2
(45) Date of Patent: Jun. 14, 2022

(54) METHODS AND APPARATUS FOR DETECTING OPEN CIRCUIT FAULTS IN A BATTERY PACK CONTAINING PARALLEL CELLS

(71) Applicant: Motorola Solutions, Inc., Chicago, IL (US)

(72) Inventors: Robert L. Snyder, Suwanee, GA (US); Donald L. Flowers, Dacula, GA (US)

(73) Assignee: Motorola Solutions, Inc., Chicago, IL (US)

( * ) Notice: Subject to any disclaimer, the term of this patent is extended or adjusted under 35 U.S.C. 154(b) by 301 days.

(21) Appl. No.: 16/454,280

(22) Filed: Jun. 27, 2019

(65) Prior Publication Data
US 2020/0412159 A1 Dec. 31, 2020

(51) Int. Cl.
*H02J 7/00* (2006.01)
*H02J 7/04* (2006.01)
*G01R 31/36* (2020.01)
*H01M 10/48* (2006.01)
*H01M 10/44* (2006.01)

(52) U.S. Cl.
CPC .............. *H02J 7/045* (2013.01); *G01R 31/36* (2013.01); *H01M 10/482* (2013.01); *H02J 7/0024* (2013.01); *H02J 7/0026* (2013.01); *H01M 10/441* (2013.01); *H01M 2200/00* (2013.01); *H01M 2220/30* (2013.01)

(58) Field of Classification Search
CPC ....................................................... H02J 7/045
USPC ......................................................... 320/134
See application file for complete search history.

(56) References Cited

U.S. PATENT DOCUMENTS

| | | | | |
|---|---|---|---|---|
| 2007/0164710 A1* | 7/2007 | Sato | ...................... | H02J 7/0014 320/134 |
| 2009/0184685 A1* | 7/2009 | Sim | ...................... | H02J 7/0086 320/134 |
| 2013/0049697 A1* | 2/2013 | Li | ...................... | H02J 7/0031 320/134 |
| 2014/0312828 A1* | 10/2014 | Vo | ...................... | H02J 7/342 320/103 |
| 2018/0368221 A1* | 12/2018 | Johnson | ................... | H02J 9/065 |
| 2019/0310321 A1* | 10/2019 | Mi | ...................... | B60L 58/22 |

FOREIGN PATENT DOCUMENTS

EP    2613423    7/2013

* cited by examiner

*Primary Examiner* — Yalkew Fantu
(74) *Attorney, Agent, or Firm* — Baker Botts L.L.P.

(57) ABSTRACT

Methods and apparatus for detecting open circuit fault conditions in a battery pack containing parallel cells include providing a first control signal to a close FET in parallel with a resistive element, the resistive element being in series with a first battery cell in a first cell path between the terminals of the battery pack, the first cell path being in parallel with a second cell path including a second battery cell. While the FET is closed, a test load is applied across the terminals and a first voltage measurement is obtained at a test point in the battery pack. The methods include providing a second control signal to open the FET, applying the test load across the terminals, obtaining a second voltage measurement at the test point, and determining whether a difference between the first and second voltage measurements indicates an open circuit fault condition in the battery pack.

18 Claims, 16 Drawing Sheets

METHODS AND APPARATUS FOR DETECTING OPEN CIRCUIT FAULTS IN A BATTERY PACK CONTAINING PARALLEL CELLS

BACKGROUND OF THE INVENTION

Feature rich portable electronic devices, including portable communication devices, require ever increasing amounts of energy from batteries in terms of higher peak load currents and higher average load currents. For example, radios have evolved from simple analog devices with peak transmission power demands to multifunction computing systems in which different software-controlled modes have different peak current demands. The radio may be restricted in terms of power consumption or current consumption to satisfy compliance with one or more safety standards, including Appareils destinés à être utilisés en ATmosphères EXplosibles (ATEX), Underwriters Laboratories (UL), and International Electrotechnical Commission System for Certification to Standards Relating to Equipment for Use in Explosive Atmospheres (IECEx), or to avoid damaging the battery or the radio due to over-charge, over-discharge, or over-current conditions.

Battery packs for powering portable electronic devices may include multiple battery cells selected based on their physical size and energy capacity. For example, space constraints may restrict the types of battery cells included in a battery pack. In addition, performance requirements under particular environmental conditions may reduce the number of suitable battery cell chemistries. Typically, the battery cells in a battery pack are identical battery cells that work together as if they are a single large battery cell. Each cell in a battery pack may receive electric current from a power supply or may deliver current to a device the battery pack is powering. In a fault condition in a battery pack, one or more cells are not being charged by a power supply at their normal rate or are not powering a device at their normal rate. A fault condition can occur, for example, due to damaged cells, failed weld connections, overheating, and other circumstances. When a fault condition occurs, and the battery pack is connected to a charger to be charged, the current to a cell or cells and the charge rate can increase beyond normal limits. Such an increase can prevent the battery from operating reliably or safely.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention and explain various principles and advantages of those embodiments.

Figure 1:
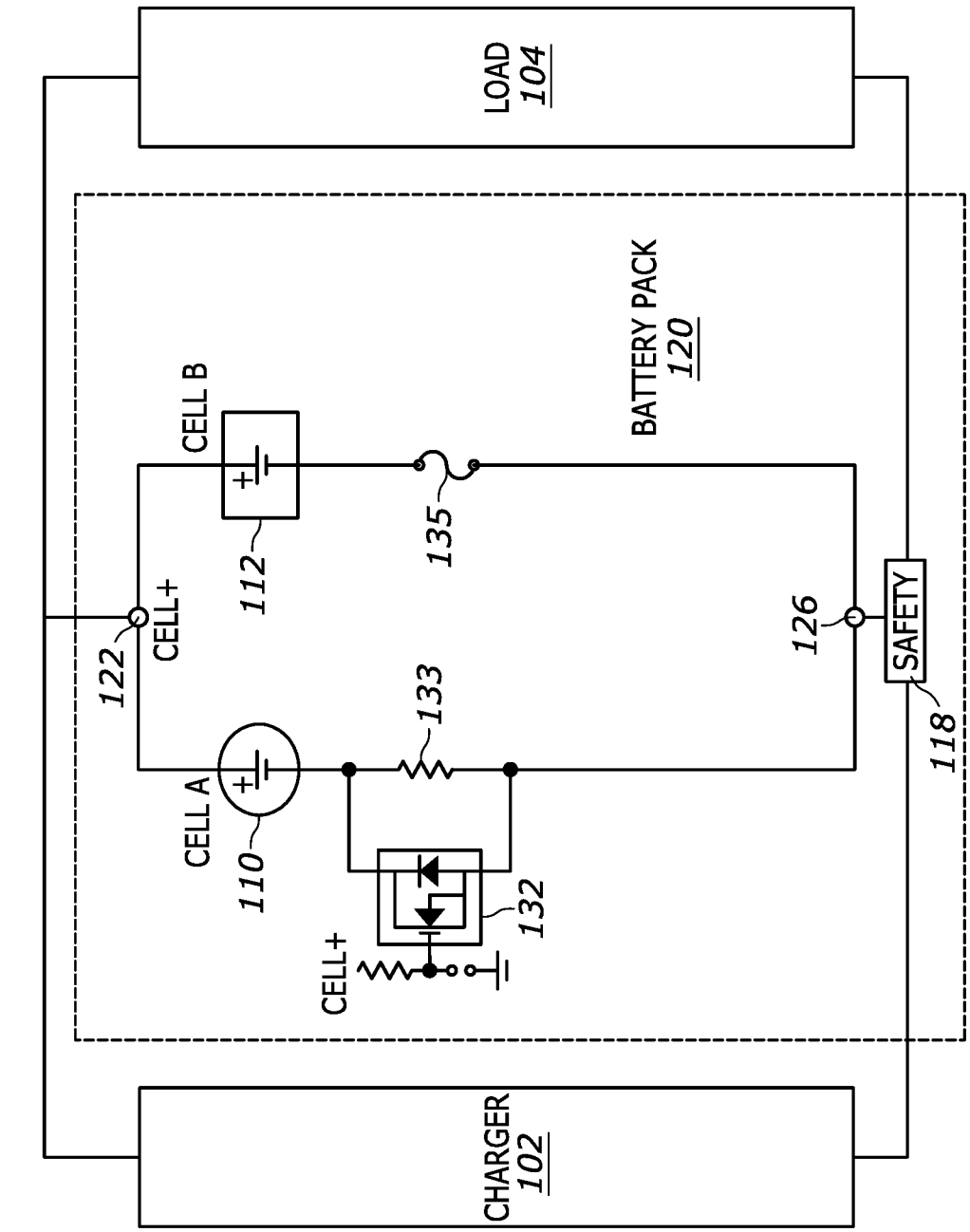
FIG. 1 is a block diagram illustrating selected elements of an example battery circuit for an electronic device including a battery pack containing battery cells of disparate types in parallel, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by suitable symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Disclosed herein are methods and apparatus for detecting an open circuit fault in a battery pack containing parallel cells. In one embodiment, a disclosed method for detecting an open circuit fault in a battery pack includes providing a first control signal to a first field-effect transistor (FET) electrically connected in parallel with a first resistive element, the first resistive element being in series with a first battery cell in a first cell path between positive and negative terminals of the battery pack, the first cell path being in parallel with a second cell path between the positive and negative terminals and including a second battery cell, and the first control signal causing the first FET to be closed. The method includes, while the first FET is closed, applying a test load across the positive and negative terminals, and obtaining a first voltage measurement at a test point in the battery pack. The method also includes providing a second control signal to the first FET causing the first FET to be open and, while the first FET is open, applying the test load across the positive and negative terminals, and obtaining a second voltage measurement at the test point. The method further includes determining that a voltage drop between the first voltage measurement and the second voltage measurement is indicative of an open circuit fault condition in the battery pack.

In one embodiment, a disclosed battery pack for an electronic device includes a first cell path between a positive terminal of the battery pack and a negative terminal of the battery pack, the first cell path including a first battery cell, a first resistive element electrically connected in series with the first battery cell, and a first field-effect transistor (FET) electrically connected in parallel with the first resistive element. The battery pack also includes a second cell path between the positive and negative terminals in parallel with the first cell path, the second cell path including a second battery cell, and a test circuit. The test circuit is configured to provide a first control signal to the first FET causing the first FET to be closed and, while the first FET is closed, to apply a test load across the positive and negative terminals and to obtain a first voltage measurement at a test point in the battery pack. The test circuit is further configured to provide a second control signal to the first FET causing the first FET to be open and while the first FET is open, to apply the test load across the positive and negative terminals and to obtain a second voltage measurement at the test point. The test circuit is also configured to determine whether a voltage difference between the first voltage measurement and the second voltage measurement is indicative of an open circuit fault condition in the battery pack.

In one embodiment, a disclosed portable electronic device includes a battery pack and one or more electrical circuits powered by the battery pack. The battery pack includes a first cell path between a positive terminal of the battery pack and a negative terminal of the battery pack, the first cell path including a first battery cell, a first resistive element electrically connected in series with the first battery cell, and a first field-effect transistor (FET) electrically connected in parallel with the first resistive element. The battery pack also includes a second cell path between the positive and negative terminals in parallel with the first cell path, the second cell path including a second battery cell, and a test circuit. The test circuit is configured to provide a first control signal to the first FET causing the first FET to be closed and, while the first FET is closed, to apply a test load across the positive and negative terminals and to obtain a first voltage measurement at a test point in the battery pack. The test circuit is further configured to provide a second control signal to the first FET causing the first FET to be open and, while the first FET is open, to apply the test load across the positive and negative terminals and to obtain a second voltage measurement at the test point. The test circuit is also configured to determine whether a voltage difference between the first voltage measurement and the second voltage measurement is indicative of an open circuit fault condition in the battery pack.

In various embodiments, the method may further include determining a location of the open circuit fault condition dependent on a magnitude of the voltage drop between the first voltage measurement and the second voltage measurement. The method may also include selecting the first resistive element dependent on a respective type or impedance of each of the first battery cell and the second battery cell. In some embodiments, the method may include taking corrective action in response to determining that the voltage drop represents an open circuit fault condition in the battery pack. The corrective action may include one or more of providing an indication that the open circuit fault condition has been detected, selecting a charging current to be used in charging the battery pack dependent on the detected open circuit fault condition, and refraining from charging the battery pack while the open circuit fault condition persists.

In at least some embodiments, the first cell path may further include a third battery cell electrically connected in series with the first battery cell, a third resistive element electrically connected in series with the third battery cell, and a third FET electrically connected in parallel with the third resistive element, and the second cell path may further include a fourth battery call electrically connected in series with the second battery cell. In at least some embodiments, the battery pack may further include a second FET electrically connected in parallel with a second resistive element, the second resistive element being in series with the second battery cell in the second cell path. In some embodiments, the battery pack may further include a third cell path between the positive and negative terminals in parallel with the first cell path and the second cell path. The third cell path may include a third battery cell, a third resistive element electrically connected in series with the third battery cell, and a third FET electrically connected in parallel with the third resistive element.

In various embodiments, the test circuit may include a processor and a memory storing instructions that when executed by the processor cause the processor to provide the first and second control signals, apply the test load, obtain the first and second voltage measurements, and determine whether a voltage difference between the first voltage measurement and the second voltage measurement is indicative of an open circuit fault condition, or a hardware state machine configured to provide the first and second control signals, apply the test load, obtain the first and second voltage measurements, and determine whether a voltage difference between the first voltage measurement and the second voltage measurement is indicative of an open circuit fault condition. In various embodiments, the open circuit fault condition may be or include an open fuse in the second cell path, an open connection in the second cell path, or a malfunction of the second battery cell. In some embodiments, the first battery cell and the second battery cell may be of different cell types or may have different impedances. In at least some embodiments, the test point may be a location in the battery pack or in the portable electronic device at which an output voltage for the battery pack or a derivative of the output voltage for the battery pack is measurable. In various embodiments, the test circuit may be implemented in the battery pack, in an element of the portable electronic device other than the battery pack, or in a charger electrically connected to the portable electronic device.

Battery packs including multiple cells of disparate cell types may be desirable for optimal space integration with portable electronic devices. In some embodiments of the battery packs described herein, battery cells of different shapes, sizes, energy capacities, and impedances may be arranged in various series and parallel configurations to take advantage of the performance characteristics of each different cell type. However, the use of different types of battery cells, such as different types of lithium-ion (Li-Ion) cells, can result in large impedance mismatches between the battery cells in some cell pack configurations. Such impedance mismatches can negatively affect charge times, battery cell cycle life, and other battery cell performance metrics in embodiments in which the charge current must be limited for battery cells within the battery pack having lower impedance than other battery cells within the battery pack. It can be challenging to design and implement a battery pack for portable electronic devices, such as radios, that include a mix of battery cells of different cell types connected together to achieve desired performance goals. In at least some embodiments, the battery cells of each different cell type may require different charge currents. However, they may all have similar voltage characteristics. For example, all of the battery cells within a battery pack may charge to the same, or a similar, voltage level regardless of differences in their shapes, sizes, energy capacities, or impedances. This may be true whether or not the battery cells are implemented using the same battery chemistries. For example, a prismatic battery cell implemented using a solid-state type lithium-ion compound and a cylindrical battery cell implemented using an electrolyte type lithium-ion compound may have similar voltage profiles, but vastly different impedances.

In a battery pack that contains multiple cells connected in various parallel or parallel-series configurations it is possible to have manufacturing defects, such as open circuit faults, introduced during the assembly process. Defects of this type are very difficult to detect when using the typical test methods that only have access to the external contacts of the battery. Defect detection is further complicated when the battery pack includes battery cells of different impedances. Defect detection is also complicated when cell balancing currents are present immediately after battery pack construction and cell connection. As a result, defective battery packs might escape typical factory testing and be delivered to customers. There are certain scenarios in which it is desirable to detect an open circuit fault condition, such as an open cell, to meet a standard such as the IEEE 1725 standard for multiple cell configurations. Providing a single voltage measurement point at which any open circuit fault condition or open cell within a battery pack could be detected in the field by an integrated test circuit is desirable.

Referring now to FIG. 1, there is provided a block diagram illustrating selected elements of an example battery circuit 100 for an electronic device containing parallel battery cells of disparate types in which a resistive element is added in series with one of the battery cells, in accordance with some embodiments. In the illustrated embodiment, battery circuit 100 includes a charger 102, a load 104, and a rechargeable battery pack 120.

As shown in FIG. 1, battery pack 120 includes one cell of a cylindrical cell type, shown as battery cell A (110), in parallel with one cell of a prismatic cell type, shown as battery cell B (112). In this example, the battery topology may be referred to as one-series-two-parallel, or 1S2P. In the illustrated example, the voltage at the positive terminal of battery pack 120 (shown as cell+ 122) may be in the range of 6.0 to 8.4 VDC. Battery pack 120 also includes a safety circuit 118.

In the illustrated example, a positive terminal of the charger 102 is connected to the positive terminal Cell+ (122) of battery pack 120 and a positive terminal of the load 104. Similarly, a negative terminal of the charger 102 is connected to a negative terminal Cell− (126) of battery pack 120 and a negative terminal of the load 104. The path between the terminals of the charger 102 and the terminals (Cell+ 122 and Cell− 126) of battery pack 120 defines a charge path of battery circuit 100 when the charger 102 charges battery pack 120.

In some embodiments, battery circuit 100 is provided in a housing of an electronic device and the charger 102 is external to the housing of the electronic device. The positive terminal and the negative terminal of the charger 102 are electrically connected to battery circuit 100 when the charger is electrically connected to the electronic device. In other embodiments, the charger 102 may reside in the housing of the electronic device. In still other embodiments, battery pack 120 and battery circuit 100 are located outside the housing of the electronic device such as in a separate housing. As will be described in more detail herein, in some embodiments, charger 102 may include a test circuit configured to detect open circuit fault conditions in battery pack 120.

Battery pack 120 provides electrical power for operation of the load 104. For example, the load 104 may include circuit components of an electronic device, such as a microprocessor, memories, amplifiers, communication circuits and the like. The electronic device may be a multifunction radio, a mobile telephone, a laptop computer, a tablet computer, a smart phone, a lighting system, a sound system, or another type of portable electronic device, in different embodiments. The positive terminal Cell+ (122) of battery pack 120 is connected to the positive terminal of the load 104 and the negative terminal Cell− (126) of battery pack 120 is connected to the negative terminal of the load 104. The path between the terminals (Cell+ 122 and Cell− 126) of battery pack 120 and the terminals of the load 104 defines a load path of battery circuit 100. In certain embodiments, the load 104 also receives electrical power from the charger 102 when battery pack 120 is charging.

In the illustrated embodiment, battery cell A (110) is a cylindrical battery cell having an impedance of 20 mΩ. The capacity of battery cell A (110) may be twice the capacity of battery cell B (112). Battery cell B (112) is a prismatic cell having an impedance of 80 mΩ. The capacity of battery cell B (112) may be half the capacity of battery cell A (110). In the illustrated example, the particular battery cells within battery pack 120 may be selected based on size constraints and the energy capacity for batteries of each battery cell type, among other criteria. For example, the smaller prismatic battery cell B (112) has higher impedance and a lower energy capacity than the larger cylindrical battery cell A (110). However, the performance characteristics of prismatic battery cell B (112) in the face of certain environmental conditions, such as their ability to provide current at low temperatures, are superior to those of the cylindrical battery cell A (110). In one example, for an electronic device with a requirement to operate at very low temperatures, such as down to −20° C., the performance of cylindrical battery cell A (110) may be insufficient. On the other hand, the prismatic battery cell B (112) may be designed to operate well at those temperatures, or at even lower temperatures. Therefore, unlike cylindrical battery cell A (110), at very low temperatures, the prismatic battery cell B (112) may provide energy capacity that is relatively stable. Combining cylindrical battery cell A (110) and prismatic battery cell B (112) within battery pack 120 may result in a better-performing battery at cold temperatures than would be possible with a battery pack containing only cylindrical battery cells. The cylindrical battery cell A (110) provides twice the energy capacity of the prismatic battery cell B (112) at higher temperatures. The resulting battery pack 120 is a high capacity battery whose performance at warmer temperatures is superior to a battery pack with only prismatic battery cells, but that provides a stable energy source for the load 104 at very low temperatures.

In the illustrated embodiment, battery circuit 100 includes a respective resistive element in series with the cylindrical battery cell A (110). More specifically, a resistor 133 having a fixed resistance of 78 mΩ is added in series with battery cell A (110). In this example, the resistive element is added in series with the cylindrical battery cell to better balance the charging of the cylindrical battery cell and the charging of the prismatic battery cell, which has a higher impedance than the cylindrical battery cell. In at least some embodiments, the amount of the fixed resistance may be selected based on the target peak charge current for the cylindrical battery cell A (110). In the illustrated example, the impendence of fuse 135, which is electrically connected in series with cell B (112), is 25 mΩ.

Battery pack 120 also includes a bypass circuit electrically coupled to the resistor 133 that, during discharge operations, is enabled to bypass resistor 133. For example, in the illustrated embodiment, a bypass circuit 132 is electrically coupled in parallel with resistor 133. In some embodiments, bypass circuit 132 includes a very low impedance field-effect transistor (FET), such as a metal-oxide-semiconductor field-effect transistor (MOSFET) that, when enabled by the assertion of a respective control signal, is configured to short across resistor 133, removing the resistance due to resistor 133. In some embodiments, the control signal may represent a control signal received from charger 102 indicating whether a charging operation is in progress. In other words, a control signal may be asserted or de-asserted to enable or disable the resistive element dependent on whether the battery cells within battery pack 120 are being charged or are discharging. In at least some embodiments, various control signals may be used to open the bypass circuit 132 during open circuit fault testing, thus enabling resistor 133, and to close the bypass circuit 132 at other times, as described herein.

In some embodiments, safety circuit 118 monitors electrical parameters of battery pack 120. For example, the safety circuit 118 may monitor, among other things, a voltage across battery pack 120 and a current flowing through battery pack 120 during charging or discharging. In at least some embodiments, the safety circuit 118 may be connected to the positive terminal (cell+122) and the negative terminal (cell− 126) of battery pack 120. In some embodiments, safety circuit 118 may use a sense resistor to monitor the current and voltage conditions of battery pack 120. The safety circuit 118 may be implemented, for example, using available integrated circuits, such as the S-8252 battery protection integrated circuit available from ABLIC, Inc. The battery protection integrated circuit may include one or more of a discharge over-current protection function and a fast short circuit protection function. In response to detecting a discharge over-current condition or a short circuit condition, safety circuit 118 may disable battery pack 120. In some embodiments, prior to disabling battery pack 120, safety circuit 118 may output a signal to load 104 indicating that battery pack 120 will be disabled in the near future (not shown).

Methods are described herein with which an open circuit fault condition, such as an open fuse, a broken connection, or a malfunction of a battery cell, in a battery pack that includes multiple battery cells connected in any of various parallel or parallel-series configurations may be detected by a test circuit that is designed into the battery pack, into a charger for the battery pack, or into an electronic device powered by the battery pack, in various embodiments. In some embodiments, all the battery cells in the battery pack may be identical. In other embodiments, at least some of the battery cells in the battery pack may have different characteristics, such as different energy capacities, voltage levels, or impedances. The methods described herein for detecting an open cell during the manufacturing process may also be implemented as a microprocessor-based self diagnostic test method for open cell detection in a battery pack that is deployed in the field. In various embodiments, the methods described herein may be used to detect open circuit fault conditions in battery pack 120. For example, a first control signal may be provided to close a FET that implements bypass circuit 132. While the FET is closed, a constant current test load, e.g., a 4-amp test load, may be applied across the terminals of battery pack 120 and a first voltage measurement may be obtained at a test point in battery pack 120. Subsequently, a second control signal may be provided to open the FET. While the FET is open, the test load may be re-applied across the terminals and a second voltage measurement may be obtained at the test point. Finally, a determination may be made as to whether a difference between the first and second voltage measurements is indicative of an open circuit fault condition in battery pack 120. For example, if a voltage drop between the first and second measurements is greater than a threshold voltage drop for battery pack 120, this may be indicative of an open circuit fault in battery pack 120. In some embodiments, the threshold voltage drop may be determined through calibration and may vary depending on the type and configuration of the battery cells in battery pack 120 and the resistance of resistor 133.

Figure 2:
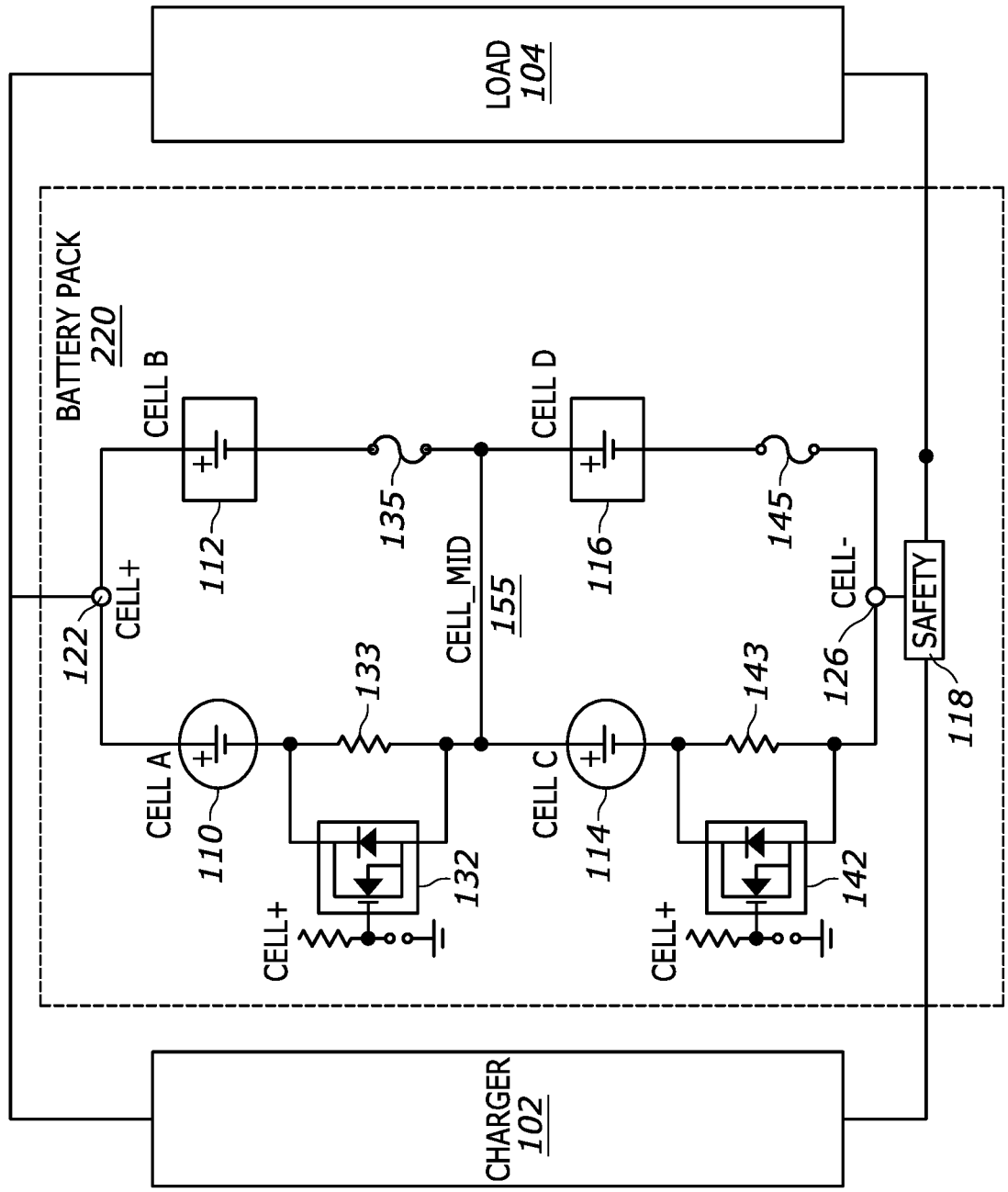
FIG. 2 is a block diagram illustrating selected elements of an example battery circuit for an electronic device including a battery pack with two cell paths each containing two battery cells, in accordance with some embodiments.

FIG. 2 is a block diagram illustrating selected elements of an example battery circuit 200 for an electronic device including a battery pack with two cell paths each containing two battery cells, in accordance with some embodiments. In the illustrated example, battery circuit 200 includes a charger 102, a load 104, and a rechargeable battery pack 220. Elements of battery circuit 200 that are similar to those of battery circuit 100 illustrated in FIG. 1 are shown having the same reference numbers in FIG. 2.

In the example embodiment illustrated in FIG. 2, battery pack 220 includes two cells of a cylindrical cell type, shown as battery cells A (110) and C (114), in parallel with two cells of a prismatic cell type, shown as battery cells B (112) and D (116). In this example, in which the battery cells of one cell type are in series with each other and then in parallel with the battery cells of the other type, the battery topology may be referred to as two-series-two-parallel, or 2S2P. In the illustrated example, the voltage at the positive terminal of battery pack 220 (shown as Cell+ 122) may be in the range of 6.0 to 8.4 VDC, while the voltage at a middle terminal of battery pack 220 (shown as cell_mid 155) may be in the range of 3.0 to 4.2 VDC. Battery pack 220 also includes a safety circuit 118.

In the illustrated example, a positive terminal of the charger 102 is connected to a positive terminal Cell+ (122) of battery pack 220 and a positive terminal of the load 104. Similarly, a negative terminal of the charger 102 is connected to a negative terminal Cell− (126) of battery pack 220 and a negative terminal of the load 104. The path between the terminals of the charger 102 and the terminals (Cell+ 122 and Cell− 126) of battery pack 220 defines a charge path of battery circuit 200 when the charger 102 charges battery pack 220.

In some embodiments, battery circuit 200 is provided in a housing of an electronic device and the charger 102 is external to the housing of the electronic device. The positive terminal and the negative terminal of the charger 102 are electrically connected to battery circuit 200 when the charger is electrically connected to the electronic device. In other embodiments, the charger 102 may reside in the housing of the electronic device. In still other embodiments, battery pack 220 and battery circuit 200 are located outside the housing of the electronic device such as in a separate housing. As will be described in more detail herein, in some embodiments, charger 102 may include a test circuit configured to detect open circuit fault conditions in battery pack 220.

Battery pack 220 provides electrical power for operation of the load 104. For example, the load 104 may include circuit components of an electronic device, such as a microprocessor, memories, amplifiers, communication circuits and the like. The electronic device may be a multifunction radio, a mobile telephone, a laptop computer, a tablet computer, a smart phone, a lighting system, a sound system, or another type of portable electronic device, in different embodiments. The positive terminal Cell+ (122) of battery pack 220 is connected to the positive terminal of the load 104 and the negative terminal Cell− (126) of battery pack 220 is connected to the negative terminal of the load 104. The path between the terminals (Cell+ 122 and Cell− 126) of battery pack 220 and the terminals of the load 104 defines a load path of battery circuit 200. In certain embodiments, the load 104 also receives electrical power from the charger 102 when battery pack 220 is charging.

In the illustrated embodiment, battery cell A (110) is a cylindrical battery cell having an impedance of 20 mΩ. The capacity of battery cell A (110) may be twice the capacity of battery cell B (112). Battery cell B (112) is a prismatic cell having an impedance of 80 mΩ. The capacity of battery cell B (112) may be half the capacity of battery cell A (110). Like battery cell A (110), battery cell C (114) is a cylindrical battery cell having an impedance of 20 mΩ. The capacity of battery cell C (114) may be equal to the capacity of battery cell A (110) and may be twice the capacity of battery cell D (116). Like battery cell B (112), battery cell D (116) is a prismatic cell having an impedance of 80 mΩ. The capacity of battery cell D (116) may be equal to the capacity of battery cell B (112) and may be half the capacity of battery cell C (114).

As in the example battery pack 120 illustrated in FIG. 1, the particular battery cells within battery pack 220 may be selected based on size constraints and the energy capacity for batteries of each battery cell type, among other criteria. For example, the smaller prismatic battery cells B (112) and D (116) have higher impedance and a lower energy capacity than the larger cylindrical battery cells A (110) and C (114). However, the performance characteristics of prismatic battery cells B (112) and D (116) in the face of certain environmental conditions, such as their ability to provide current at low temperatures, are superior to those of the cylindrical battery cells A (110) and C (114). In one example, for an electronic device with a requirement to operate at very low temperatures, such as down to −20° C., the performance of cylindrical battery cells A (110) and C (114) may be insufficient. On the other hand, the prismatic battery cells B (112) and D (116) may be designed to operate well at those temperatures, or at even lower temperatures. Therefore, unlike cylindrical battery cells A (110) and C (114), at very low temperatures, the prismatic battery cells B (112) and D (116) may provide energy capacity that is relatively stable. Combining both cylindrical battery cells A (110) and C (114) and prismatic battery cells B (112) and D (116) within battery pack 220 may result in a better-performing battery at cold temperatures than would be possible with a battery pack containing only cylindrical battery cells. The cylindrical battery cells A (110) and C (114) provide twice the energy capacity of the prismatic battery cells B (112) and D (116) at higher temperatures. The resulting battery pack 220 is a high capacity battery whose performance at warmer temperatures is superior to a battery pack with only prismatic battery cells, but that provides a stable energy source for the load 104 at very low temperatures.

In the illustrated embodiment, battery circuit 200 includes a respective resistive element in series with each of the cylindrical battery cells A (110) and C (114). More specifically, a resistor 133 having a fixed resistance of 78 mΩ is added in series with battery cell A (110) and a resistor 143 having a fixed resistance of 78 mΩ is added in series with battery cell C (114). In at least some embodiments, the amount of the fixed resistance may be selected based on the target peak charge current for the cylindrical battery cells A (110) and C (114). In the illustrated example, the impendence of fuse 135, which is electrically connected in series with cell B (112), is 25 mΩ and the impendence of fuse 145, which is electrically connected in series with cell D (116), is 25 mΩ.

Battery pack 220 also includes a respective bypass circuit electrically coupled to each of the resistors 133 and 143 that, during discharge operations, is enabled to bypass the resistor. For example, in the illustrated embodiment, a bypass circuit 132 is electrically coupled in parallel with resistor 133 and a bypass circuit 142 is electrically coupled in parallel with resistor 143. In some embodiments, each of the bypass circuits 132 and 142 includes a very low impedance FET that, when enabled by the assertion of a respective control signal, is configured to short across a respective one of the resistors 133 or 143, removing the resistance due to the resistor 133 or 143. In some embodiments, the control signal may represent a control signal received from charger 102 indicating whether a charging operation is in progress. In other words, a control signal may be asserted or de-asserted to enable or disable one or both of the resistive elements dependent on whether the battery cells within battery pack 220 are being charged or are discharging. In at least some embodiments, various control signals may be used to open bypass circuit 132 or bypass circuit 142 during open circuit fault testing, thus enabling resistor 133 or resistor 143, respectively, and to close the bypass circuit 132 or the bypass circuit 142 at other times, as described herein.

In some embodiments, safety circuit 118 monitors electrical parameters of battery pack 220. For example, the safety circuit 118 may monitor, among other things, a voltage across battery pack 220 and a current flowing through battery pack 220 during charging or discharging. In at least some embodiments, the safety circuit 118 may be connected to the positive terminal (Cell+ 122), the negative terminal (Cell− 126), and the middle terminal (cell_mid 155) of battery pack 220. In some embodiments, safety circuit 118 may use a sense resistor to monitor the current and voltage conditions of battery pack 220. In response to detecting a discharge over-current condition or a short circuit condition, safety circuit 118 may disable battery pack 220. In some embodiments, prior to disabling battery pack 220, safety circuit 118 may output a signal to load 104 indicating that battery pack 220 will be disabled in the near future (not shown).

Unlike with traditional open circuit testing methods, the methods described herein for detecting open circuit fault conditions in a battery pack including battery cells in multiple parallel cells paths may be used to detect whether either or both of prismatic battery cell B (112) and prismatic battery cell D (116) are open due to an open fuse or a connection failure. Such faults may be difficult, if not impossible, to detect using traditional methods due to the large differences in impedance between the prismatic cells B (112) and D (116) because the change in impedance due to a loss of the higher impedance cell cannot be detected using traditional testing methods. Open circuit testing is further complicated if the test is required to run immediately after connecting the cells and if there is significant balancing current due to difference in cell voltages for the battery cells of a first cell type, such as cell A (110) and cell C (114), and the battery cells of a second cell type, such as cell B (112) and cell D (116). Simulations have shown that it is not feasible to detect an open cell or an open fuse in the high impedance fuse path of a battery pack that includes battery cells of different cell types that have vastly difference impedances, where feasibility is defined by an acceptable worst-case margin for a production environment. For example, in one simulation which modeled an open circuit at cell B (112) in battery circuit 200 as an open fuse 135, the resulting voltage drop due to the open fuse was, at only 0.06 V, too small to be a reliable indicator of an open circuit fault condition in a production environment.

In at least some embodiments, the systems and method described herein for detecting open circuit fault conditions may, by closing various FETs during open circuit testing to remove the resistors added for impedance balancing, be able to detect open circuit faults in what would otherwise be the higher impedance path. For example, in some embodiments, impedance is added to cells A (110) and C (114) in the form of resistors 133 and 143 in order to match or exceed the impedance of cells B (112) and D (116). Since those resistors are added to the lower impedance path, if a fuse in a higher impedance path, such as between cell B (112) or cell D (116) and one of the battery terminals, were to open, this open circuit fault condition may be detected by placing a load on the output of the battery and determining how far the output voltage drops when compared to the output voltage when the resistors are removed by closing a respective FET. In other words, opening the FETs to add resistance on what is otherwise the lower impedance path makes that path the higher impedance path. Therefore, an open circuit fault will be detectable in what was otherwise the higher impedance path. In addition to detecting an open fuse in the battery pack, this method may also be used to detect if any of the battery cells themselves are open.

In at least some embodiments, the systems described herein may include a single voltage measurement test point in a location in the battery pack at which an output voltage for the battery pack or a derivative of the output voltage for the battery pack is measurable. In at least some embodiments, the location of a detected open circuit fault condition may be determined based on the magnitude of the voltage drop induced by the detected open circuit fault condition as measured at the single test point. In some embodiments, having a single voltage measurement test point at which multiple open circuit fault conditions can be detected may improve manufacturability and operability for the battery pack. For example, only a single analog-to-digital convertor (ADC), or interface thereto, may be needed to measure the voltages required to detect open circuit fault conditions in multiple cell paths or battery cells thereof. In some embodiments, the open circuit fault testing methods and single voltage measurement test point described herein may simplify the control mechanisms for performing open circuit fault testing. For example, in some embodiments, a test circuit implemented in the battery pack, in an element of a portable electronic device other than the battery pack, or in a charger electrically connected to a portable electronic device that includes a battery pack, may be configured to provide digital control signals to open and close various FETs, to apply the test load to the battery pack terminals, and to obtain voltage measurements at the single voltage measurement test point in the battery pack. In various embodiments, the test circuit may include a processor and a memory storing instructions that when executed by the processor cause the processor to perform these and other operations, or a hardware state machine configured to perform the operations.

Figure 3:
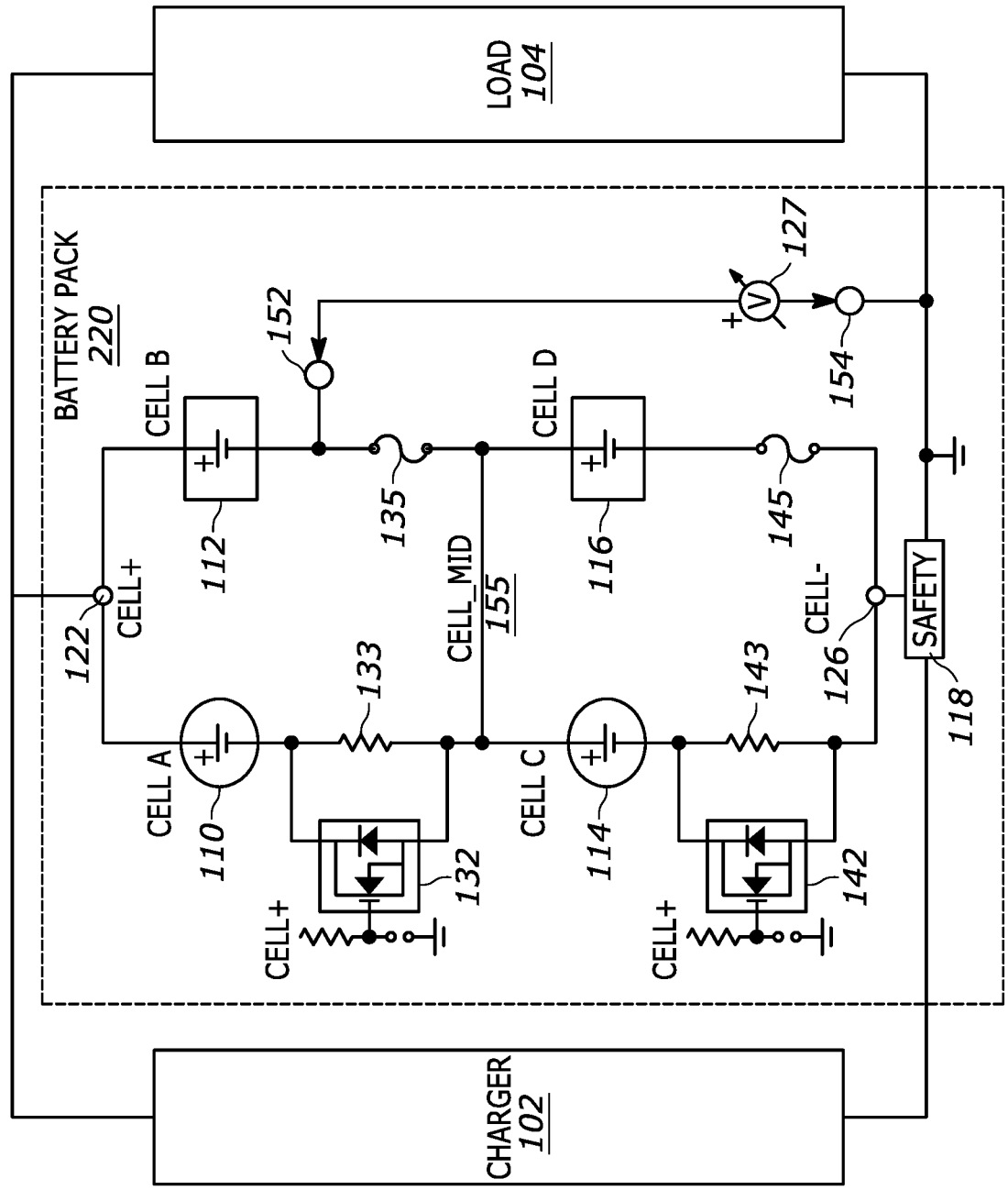
FIG. 3 is a block diagram illustrating selected elements of an example battery circuit for an electronic device including a battery pack with two cell paths each containing two battery cells and a test point at which a voltage drop is measurable to detect open circuit fault conditions, in accordance with some embodiments.

FIG. 3 is a block diagram illustrating selected elements of an example battery circuit 300 for an electronic device including a battery pack with two cell paths each containing two battery cells and a test point at which a voltage drop is measurable to detect open circuit fault conditions, in accordance with some embodiments. In the illustrated example, a battery circuit 300 includes a charger 102, a load 104, and a rechargeable battery pack 220. Elements of battery circuit 300 that are similar to those of battery circuit 100 illustrated in FIG. 1 or battery circuit 200 illustrated in FIG. 2 are shown having the same reference numbers in FIG. 3.

In addition to the elements illustrated in FIG. 2, FIG. 3 illustrates several additional elements of battery pack 220. For example, FIG. 3 illustrates the test pads for a single voltage measurement test point at which an output voltage for the battery pack or a derivative of the output voltage for the battery pack is measurable for open circuit fault testing. More specifically, FIG. 3 illustrates a test pad 152 at the single voltage measurement test point within battery pack 220 and a test pad 154 at a location corresponding to a ground in battery pack 220. In the illustrated embodiment, voltmeter 127 may be controlled to measure the voltage between the two test pads 152 and 154 during open circuit fault testing for battery pack 220. For example, a control signal (not shown) may be provided to voltmeter 127 to measure the voltage at the single voltage measurement test point while FETs 132 and 142 are closed and a constant current test load is applied across the terminals of battery pack 220. The control signal may again be provided to voltmeter 127 to measure the voltage at the single voltage measurement test point while one or both of FETs 132 and 142 are open and a constant current test load is applied across the terminals of battery pack 220. In some embodiments, the location of the single voltage measurement test point represented by test pad 152 may be particularly well suited for a test point at which a voltage drop is measurable to detect open circuit fault conditions such as an open cell or an open fuse in the high impedance path in battery pack 220, i.e., the cell path including cells B (112) and D (116). Using simulation model 400, an open circuit fault condition may be simulated by putting fuse 135 or 145 in an open state, or by opening one of switches 156 or 158, which are closed when simulating normal operation.

In various embodiments, the control signal may be provided to voltmeter 127 by a test circuit within battery pack 220, within charger 102, or within an electronic device that is powered by battery pack 220. As described herein, control signals (not shown) for opening and closing FETs 132 and 142 may be provided to the FETs by a test circuit within battery pack 220, within charger 102, or within an electronic device that is powered by battery pack 220.

Simulations have demonstrated the advantages of the open circuit fault testing methods described herein over methods for open circuit fault testing in battery packs with parallel battery cells currently being used in industry. For example, the margins provided by the disclosed open circuit fault testing methods have been shown to be on the order of two times greater than traditional methods in which voltages are measured across each cell under load. The disclosed open circuit fault testing methods, in which voltages are measured at a single voltage measurement test point, may also provide benefits in embodiments in which the accessibility of probe points is limited during the manufacturing process. The simulations described below illustrate the effectiveness of the disclosed approach to test probe access, when combined with the addition of equalization resistors that can be enabled or disabled, to detect any open cell or open fuse within a battery pack containing parallel cells of disparate cell types.

Figure 4:
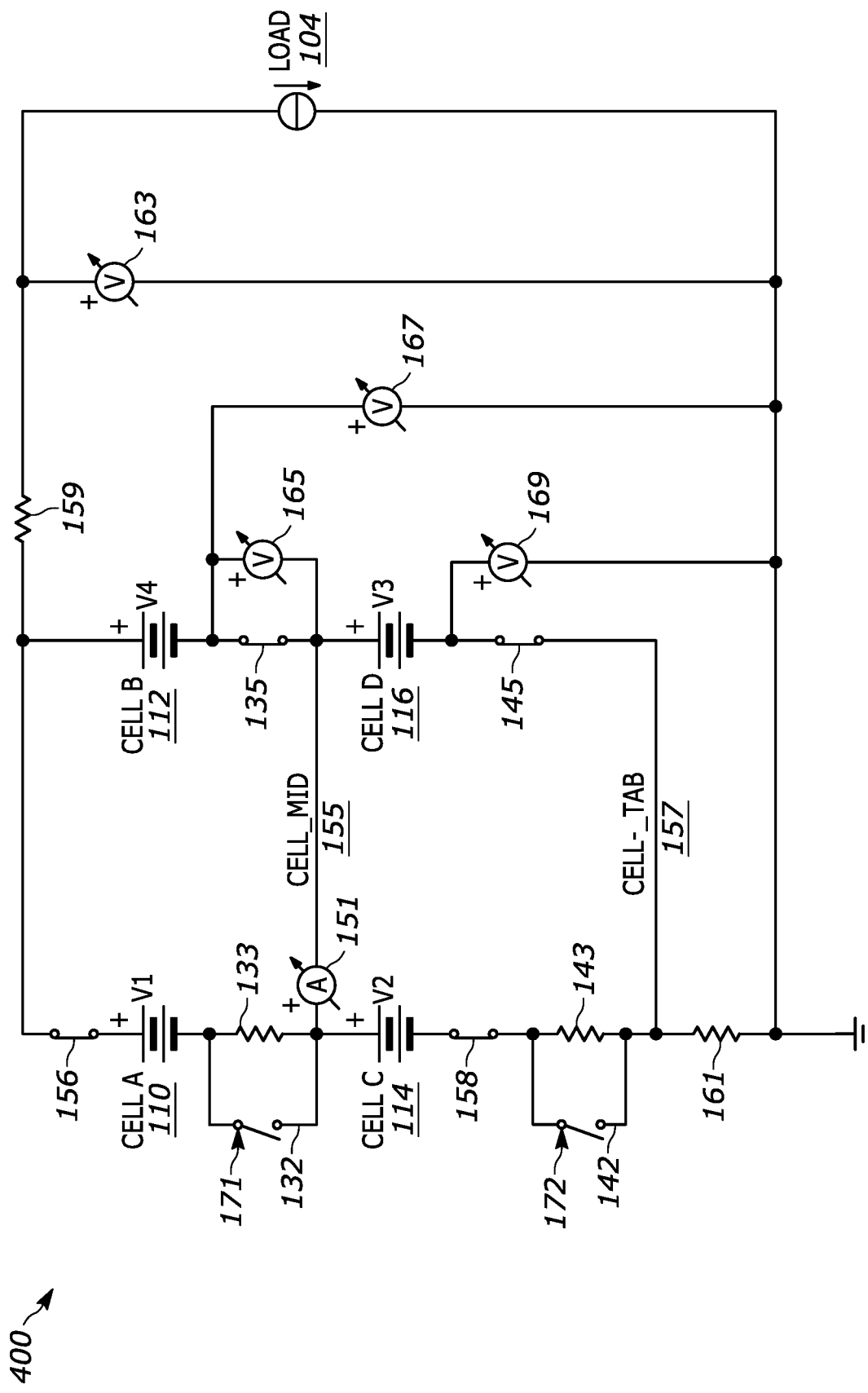
FIG. 4 is a schematic diagram illustrating a simulation model of a battery pack including two cell paths and configured for detecting open circuit fault conditions, in accordance with some embodiments.

FIG. 4 is a schematic diagram illustrating a simulation model 400 of a battery pack including two cell paths and configured for detecting open circuit fault conditions, in accordance with some embodiments. In this example, the simulated battery pack is similar to battery pack 220 illustrated in FIGS. 2 and 3, where like reference numbers represent like elements. In simulation model 400, signal 171 represents a digital control signal for closing FET 132, when in one state, and opening FET 132, when in another state. Similarly, signal 172 represents a digital control signal for closing FET 142, when in one state, and opening FET 142, when in another state. In this example simulation, the value of resistor 159 is 50 mΩ, the value of resistor 161 is 32 mΩ, and the value of resistors 133 and 143 is 78 mΩ. In the illustrated example, with no load on the battery pack, the voltage across each of the four battery cells, as measured at voltmeter 167, is 3.8 V.

FIG. 4 illustrates the state of the simulation components when all cells are connected in a 2S2P topology, as shown, and FETs 132 and 142 are open, enabling resistors 133 and 143 in the cell path that includes battery cells A (110) and C (114). While the simulation components are configured in the illustrated manner and there are no open circuit fault conditions, a simulated constant current test load 104 of 4 amps is applied across the terminals of the battery pack and a baseline pack output voltage is measured as 6.86 V using simulated voltmeter 163. With the test load 104 applied, the voltage at voltmeter 167 is 3.42 V. This represents a voltage drop of 0.380 V due to the application of test load 104, which establishes a threshold voltage drop for the battery pack. In this example, if a voltage drop significantly greater than 0.0380 V is measured at voltmeter 167 during open circuit fault testing, this may be indicative of an open circuit fault condition. With the test load 104 applied and no open circuit fault conditions, the voltage at voltmeter 165 is −48.28 mV, the voltage at voltmeter 169 is −180.28 mV, and the current at ammeter 151 is −4.38 fA (zero A).

Figure 5:
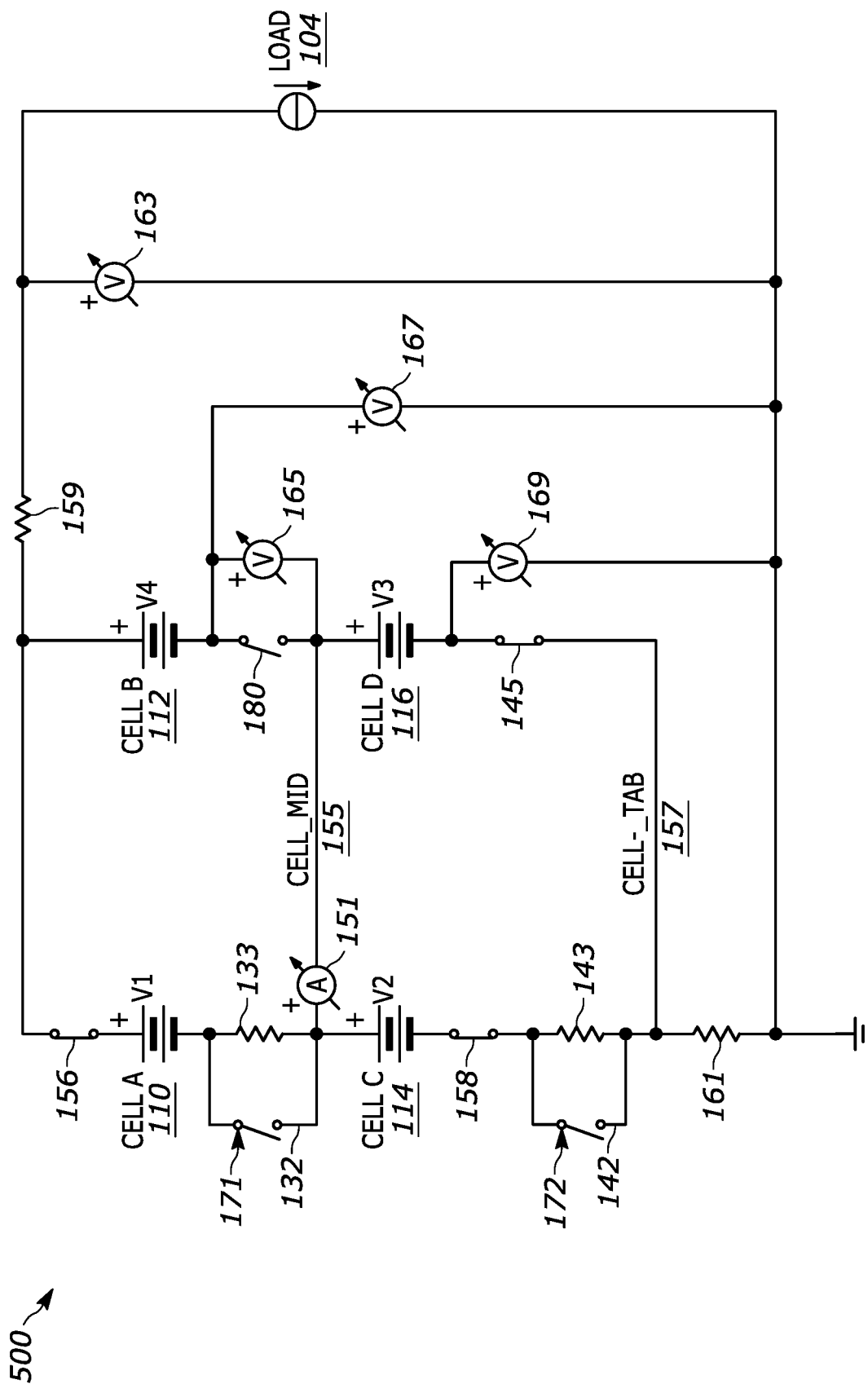
FIG. 5 is a schematic diagram illustrating a simulation of the detection of an open circuit fault condition in a battery pack including two cell paths, in accordance with some embodiments.

FIG. 5 is a schematic diagram 500 illustrating a simulation of the detection of an open circuit fault condition in a battery pack including two parallel cell paths, in accordance with some embodiments. More specifically, diagram 500 illustrates the detection of an open circuit fault condition at cell B (112) in the simulation model 400 illustrated in FIG. 4 and described above. In this example, an open circuit fault condition is simulated at 180, with fuse 135 in an open state. While the simulation components are configured in the illustrated manner, a simulated constant current test load 104 of 4 amps is applied across the terminals of the battery pack and the pack output voltage is measured as 6.67 V using simulated voltmeter 163. With the test load 104 applied, the voltage at voltmeter 167 is 3.07 V. This represents a voltage drop of 0.730 V due to the application of test load 104, which is 0.350 V greater than the threshold voltage drop for the battery pack of 0.380 V, indicating the presence of an open circuit fault condition in the battery pack with sufficient margin to be used in production. With the test load 104 applied and the open circuit fault condition present, the voltage at voltmeter 165 is −392 mV, the voltage at voltmeter 169 is −180.28 mV, and the current at ammeter 151 is −1.93 A.

The simulation model 400 shown in FIG. 4 may be used to simulate open circuit faults at each of the other cells in the battery pack with, in most cases, similar results. For example, simulation model 400 may be used to simulate the detection of an open circuit fault condition at cell D (116). In this example, an open circuit fault condition is simulated by putting fuse 145 in an open state. While the simulation components are configured in this manner, a simulated constant current test load 104 of 4 amps is applied across the terminals of the battery pack and the pack output voltage is measured as 6.67 V using simulated voltmeter 163. With the test load 104 applied, the voltage at voltmeter 167 is 3.23 V. This represents a voltage drop of 0.570 V due to the application of test load 104, which is 0.190 V greater than the threshold voltage drop for the battery pack of 0.380 V, indicating the presence of an open circuit fault condition in the battery pack with sufficient margin to be used in production. With the test load 104 applied and the open circuit fault condition present, the voltage at voltmeter 165 is −48.28 mV, the voltage at voltmeter 169 is −524 mV, and the current at ammeter 151 is 1.93 A.

In another example, simulation model 400 may be used to simulate the detection of an open circuit fault condition at cell C (114). In this example, an open circuit fault condition is simulated by opening switch 158. While the simulation components are configured in the illustrated manner, a simulated constant current test load 104 of 4 amps is applied across the terminals of the battery pack and the pack output voltage is measured as 6.65 V using simulated voltmeter 163. With the test load 104 applied, the voltage at voltmeter 167 is 3.2 V. This represents a voltage drop of 0.600 V due to the application of test load 104, which is 0.220 V greater than the threshold voltage drop for the battery pack of 0.380 V, indicating the presence of an open circuit fault condition in the battery pack with sufficient margin to be used in production. With the test load 104 applied and the open circuit fault condition present, the voltage at voltmeter 165 is −48.28 mV, the voltage at voltmeter 169 is −180.28 mV, and the current at ammeter 151 is −2.07 A.

If simulation model 400 is used to simulate an open circuit fault condition at cell A (110), the open circuit fault condition might or might not be detected. In this example, an open circuit fault condition is simulated by opening switch 156. While the simulation components are configured in the illustrated manner, a simulated constant current test load 104 of 4 amps is applied across the terminals of the battery pack and the pack output voltage is measured as 6.65 V using simulated voltmeter 163. In this example, with the test load 104 applied and the open circuit fault condition present, the voltage at voltmeter 165 is −100 mV, the voltage at voltmeter 169 is −180.28 mV, and the current at ammeter 151 is 2.07 A. With the test load 104 applied, the voltage at voltmeter 167 is 3.37 V. This represents a voltage drop of 0.430 V due to the application of test load 104, which is only 0.050 V greater than the threshold voltage drop for the battery pack of 0.380. This margin may be insufficient to be relied on as an indicator of the presence of an open circuit fault condition in the battery pack in production. However, in a different embodiment, and in a corresponding different simulation model, the value of resistors 133 and 143 may be adjusted to increase the margin for this case. For example, replacing the 78 mΩ resistors with 1Ω resistors would make a significant difference in the ability to detect an open circuit fault condition at cell A (110). Alternatively, the margin may be increased by increasing the current of the applied test load 104.

In some embodiments, the techniques employed in the example battery packs illustrated in FIGS. 1, 2, and 3 may be extended for detecting open circuit fault conditions, such as open cells and open connections, in a battery pack having any number of battery cells in a various parallel or parallel-series configurations. In some embodiments, these techniques may be implemented as a microprocessor based self-diagnostic capability, with the microprocessor residing in the battery pack, in a charger for the battery pack, or on an electronic device powered by the battery pack. The microprocessor may have the ability to read the pack output voltage and to provide output control bits for each parallel cell path of the battery pack. In some embodiments, this microprocessor-based approach may be implemented in battery pack that need to meet the IEEE 1725 standard, which requires a method to detect an open cell connection or an open fuse while the battery pack is in the field.

Figure 6:
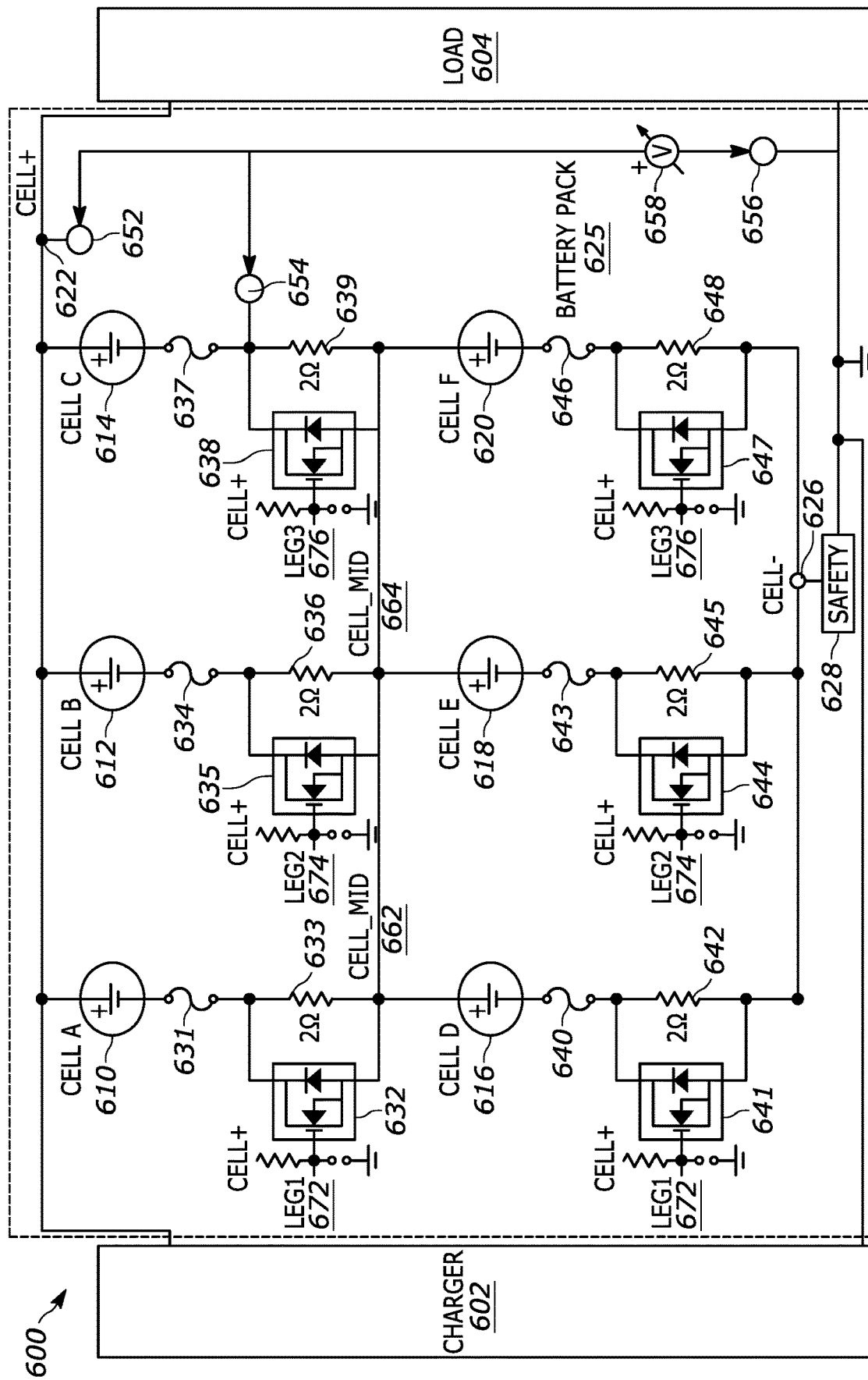
FIG. 6 is a block diagram illustrating selected elements of an example battery circuit for an electronic device including a battery pack with three cell paths each containing two battery cells and a test point at which a voltage drop is measurable to detect open circuit fault conditions, in accordance with some embodiments.

FIG. 6 is a block diagram illustrating selected elements of an example battery circuit 600 for an electronic device including a battery pack with three cell paths each containing two battery cells and a test point at which a voltage drop is measurable to detect open circuit fault conditions, in accordance with some embodiments. In this example, battery circuit 600 may be in compliance with the IEEE 1725 standard for Cell Open Detection for Microprocessor Interface. In the illustrated example, battery circuit 600 includes a charger 602, a load 604, and a rechargeable battery pack 625. In the example embodiment illustrated in FIG. 6, battery pack 625 includes six battery cells of a cylindrical cell type arranged in three parallel cell paths between the positive and negative terminals of the battery pack. More specifically, a first cell path includes cell A (610) in series with cell D (616), a second cell path includes cell B (612) in series with cell E (618), and a third cell path includes cell C (614) in series with cell F (620). In this example, in which battery cells are in series with each other within each cell path and the cell paths are in parallel with each other, the battery topology may be referred to as two-series-three-parallel, or 2S3P. In the illustrated example, the voltage at the positive terminal of battery pack 625 (shown as Cell+ 622) may be in the range of 6.0 to 8.4 VDC, while the voltage at two middle terminals of battery pack 625 (shown as cell_mid 662 and cell_mid 664) may be in the range of 3.0 to 4.2 VDC. Battery pack 220 also includes a safety circuit 628.

In the illustrated example, a positive terminal of the charger 602 is connected to a positive terminal Cell+ (622) of battery pack 625 and a positive terminal of the load 604. Similarly, a negative terminal of the charger 602 is connected to a negative terminal Cell− (626) of battery pack 625 and a negative terminal of the load 604. The path between the terminals of the charger 602 and the terminals (Cell+ 622 and Cell− 626) of battery pack 625 defines a charge path of battery circuit 600 when the charger 602 charges battery pack 625.

In some embodiments, battery circuit 600 is provided in a housing of an electronic device and the charger 602 is external to the housing of the electronic device. The positive terminal and the negative terminal of the charger 602 are electrically connected to battery circuit 600 when the charger is electrically connected to the electronic device. In other embodiments, the charger 602 may reside in the housing of the electronic device. In still other embodiments, battery pack 625 and battery circuit 600 are located outside the housing of the electronic device such as in a separate housing. As will be described in more detail herein, in some embodiments, charger 602 may include a test circuit configured to detect open circuit fault conditions in battery pack 625.

Battery pack 625 provides electrical power for operation of the load 604. For example, the load 604 may include circuit components of an electronic device, such as a microprocessor, memories, amplifiers, communication circuits and the like. The electronic device may be a multifunction radio, a mobile telephone, a laptop computer, a tablet computer, a smart phone, a lighting system, a sound system, or another type of portable electronic device, in different embodiments. The positive terminal Cell+ (622) of battery pack 625 is connected to the positive terminal of the load 604 and the negative terminal Cell− (626) of battery pack 625 is connected to the negative terminal of the load 604. The path between the terminals (Cell+ 622 and Cell− 626) of battery pack 625 and the terminals of the load 604 defines a load path of battery circuit 600. In certain embodiments, the load 604 also receives electrical power from the charger 602 when battery pack 625 is charging.

In the illustrated embodiment, all of the battery cells A (610), B (612), C (614), D (616), E (618) and F (620) are cylindrical battery cells having an impedance of 20 mΩ. The particular battery cells within battery pack 625 may be selected based on size constraints and the respective energy capacities for battery cells of particular cell types, among other criteria. For example, smaller prismatic battery cells may have higher impedance and a lower energy capacity than the larger cylindrical battery cells included in battery pack 625. However, as described above, the performance characteristics of prismatic battery cells in the face of certain environmental conditions, such as their ability to provide current at low temperatures, are superior to those of cylindrical battery cells. On the other hand, prismatic battery cells may be designed to operate well at those temperatures, or at even lower temperatures.

In the illustrated embodiment, battery circuit 600 includes a respective resistive element in series with each of the cylindrical battery cells A (610), B (612), C (614), D (616), E (618) and F (620). More specifically, a resistor 633 having a fixed resistance of 2 mΩ is added in series with battery cell A (610), a resistor 636 having a fixed resistance of 2 mΩ is added in series with battery cell B (612), a resistor 639 having a fixed resistance of 2 mΩ is added in series with battery cell C (614), a resistor 642 having a fixed resistance of 2 mΩ is added in series with battery cell D (616), a resistor 645 having a fixed resistance of 2 mΩ is added in series with battery cell E (618), and a resistor 648 having a fixed resistance of 2 mΩ is added in series with battery cell F (620). In at least some embodiments, the amount of the fixed resistance may be selected based on the target peak charge current for the cylindrical battery cells. In the illustrated example, each of the battery cells A (610), B (612), C (614), D (616), E (618) and F (620) is electrically connected in series with a fuse, shown as fuses 631, 634, 637, 640, 642, and 646, respectively.

Battery pack 625 also includes a respective bypass circuit electrically coupled to each of the resistors is series with the battery cells A (610), B (612), C (614), D (616), E (618) and F (620) that, during discharge operations, is enabled to bypass the resistor. For example, in the illustrated embodiment, bypass circuits 632, 635, 638, 641, 644, and 647 are electrically coupled in parallel with resistors 633, 636, 639, 642, 645, and 648, respectively and each of the bypass circuits includes a very low impedance FET that, when enabled by the assertion of a respective control signal, is configured to short across a respective one of the resistors, removing the resistance due to the resistor. In some embodiments, the control signal may represent a control signal received from charger 602 indicating whether a charging operation is in progress. In other words, a control signal may be asserted or de-asserted to enable or disable one or both of the resistive elements dependent on whether the battery cells within battery pack 625 are being charged or are discharging. In at least some embodiments, various control signals may be used to open a pair of bypass circuits in one of the cell paths in battery pack 625 during open circuit fault testing, thus enabling the resistors in that cell path, and to close those bypass circuits at other times, as described herein. For example, signal 672 represents a digital control signal for closing FETs 632 and 641 in a first cell path referred to as leg1, when in one state, and opening FETs 632 and 641, when in another state. Similarly, signal 674 represents a digital control signal for opening and closing FETs 635 and 644 in a second cell path referred to as leg2, and signal 676 represents a digital control signal for opening and closing FETs 635 and 644 in a third cell path referred to as leg3.

In some embodiments, safety circuit 628 monitors electrical parameters of battery pack 625. For example, the safety circuit 628 may monitor, among other things, a voltage across battery pack 625 and a current flowing through battery pack 625 during charging or discharging. In at least some embodiments, the safety circuit 628 may be connected to the positive terminal (Cell+ 622), the negative terminal (Cell− 626), and the middle terminals (cell_mid 662 and cell_mid 664) of battery pack 625. In some embodiments, safety circuit 628 may use a sense resistor to monitor the current and voltage conditions of battery pack 625. In response to detecting a discharge over-current condition or a short circuit condition, safety circuit 628 may disable battery pack 625. In some embodiments, prior to disabling battery pack 625, safety circuit 628 may output a signal to load 604 indicating that battery pack 625 will be disabled in the near future (not shown).

In the illustrated example, battery pack 625 includes test pads for a single voltage measurement test point at which an output voltage for battery pack 625 or a derivative of the output voltage for battery pack 625 is measurable for open circuit fault testing. More specifically, FIG. 6 illustrates a test pad 654 at the single voltage measurement test point within battery pack 625 and a test pad 656 at a location corresponding to a ground in battery pack 625. The test point at test pad 654 may represent a measurement point for one-half of cell positive for a low voltage A/D converter. In the illustrated embodiment, voltmeter 658 may be controlled to measure the voltage between the two test pads 654 and 656 during open circuit fault testing for battery pack 625. For example, a control signal (not shown) may be provided to voltmeter 658 to measure the voltage at the single voltage measurement test point while all of the FETs are closed and a constant current test load is applied across the terminals of battery pack 625. The control signal may again be provided to voltmeter 658 to measure the voltage at the single voltage measurement test point while particular FETs are open and a constant current test load is applied across the terminals of battery pack 625, which may be considered a derivative of cell positive for the battery pack. In the illustrated example, voltmeter 658 may also be controllable to measure the pack output voltage by measuring the voltage between a test pad 652, representing Cell+ (622), and test pad 656, representing ground.

Figure 7:
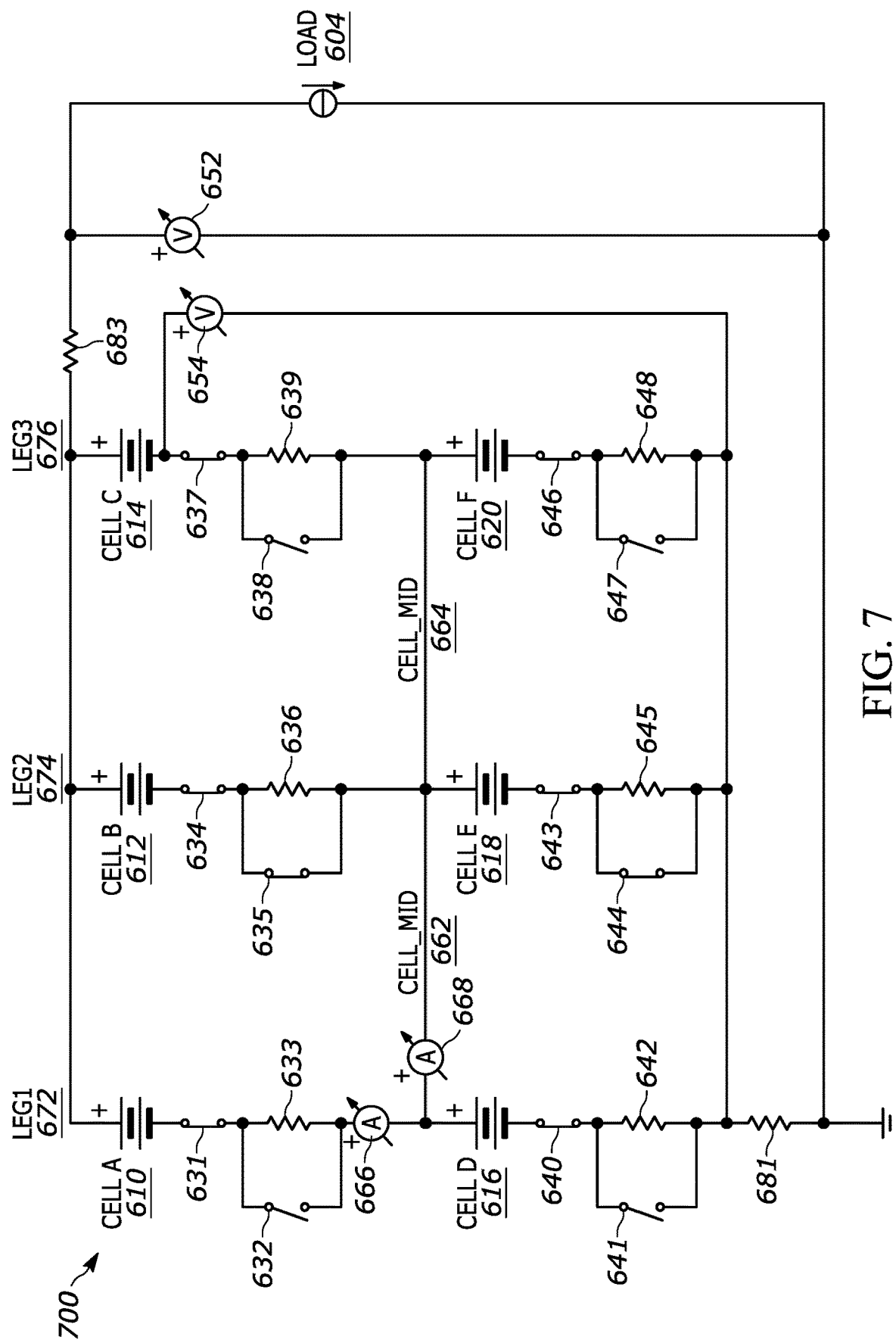
FIG. 7 is a schematic diagram illustrating a simulation model of a battery pack including three cell paths and configured for detecting open circuit fault conditions, in accordance with some embodiments.

FIG. 7 is a schematic diagram illustrating a simulation model 700 of a battery pack including three cell paths and configured for detecting open circuit fault conditions, in accordance with some embodiments. In this example, the simulated battery pack is similar to battery pack 625 illustrated in FIG. 6, where like reference numbers represent like elements. FIG. 7 illustrates the state of the simulation components when FETs 632 and 641 in leg1 and FETs 638 and 647 in leg3, are open, enabling resistors 633, 639, 642, and 648, and FETs 635 and 644 in leg2 are closed, bypassing resistors 636 and 645. In this example simulation, the value of resistor 683 is 50 mΩ and the value of resistor 681 is 33 mΩ. In the illustrated example, with no load on the battery pack, and no open circuit fault conditions present in the battery pack, the voltage across each of the six battery cells, measured at the single voltage measurement test point 654 is 3.8 V, and the unloaded pack output voltage measured at simulated voltmeter 652 is 7.6 V.

Simulations were performed using simulation model 700 in which an external 500 mA test load was applied. Voltage measurements were determined at the two points described above and identical results were obtained for cell opens in each parallel leg of the pack. As noted above, using the pack output voltage and a nominal cell voltage of 3.8 V for each of the six battery cells, the unloaded pack output voltage was 7.6 V. While the simulation components were configured in the illustrated manner and there were no open circuit fault conditions, a simulated constant current test load 604 of 500 mA was applied across the terminals of the battery pack. With all cells connected and the 500 mA load applied, the pack output voltage was 7.5 V, representing a threshold voltage drop of 0.1 V, and the voltage at test point 654 was 3.74 V, representing a threshold voltage drop of 0.06 V. The current at ammeter 666 was −13.76 mA and the current at ammeter 668 was −4.44 fA (zero A).

Figure 8:
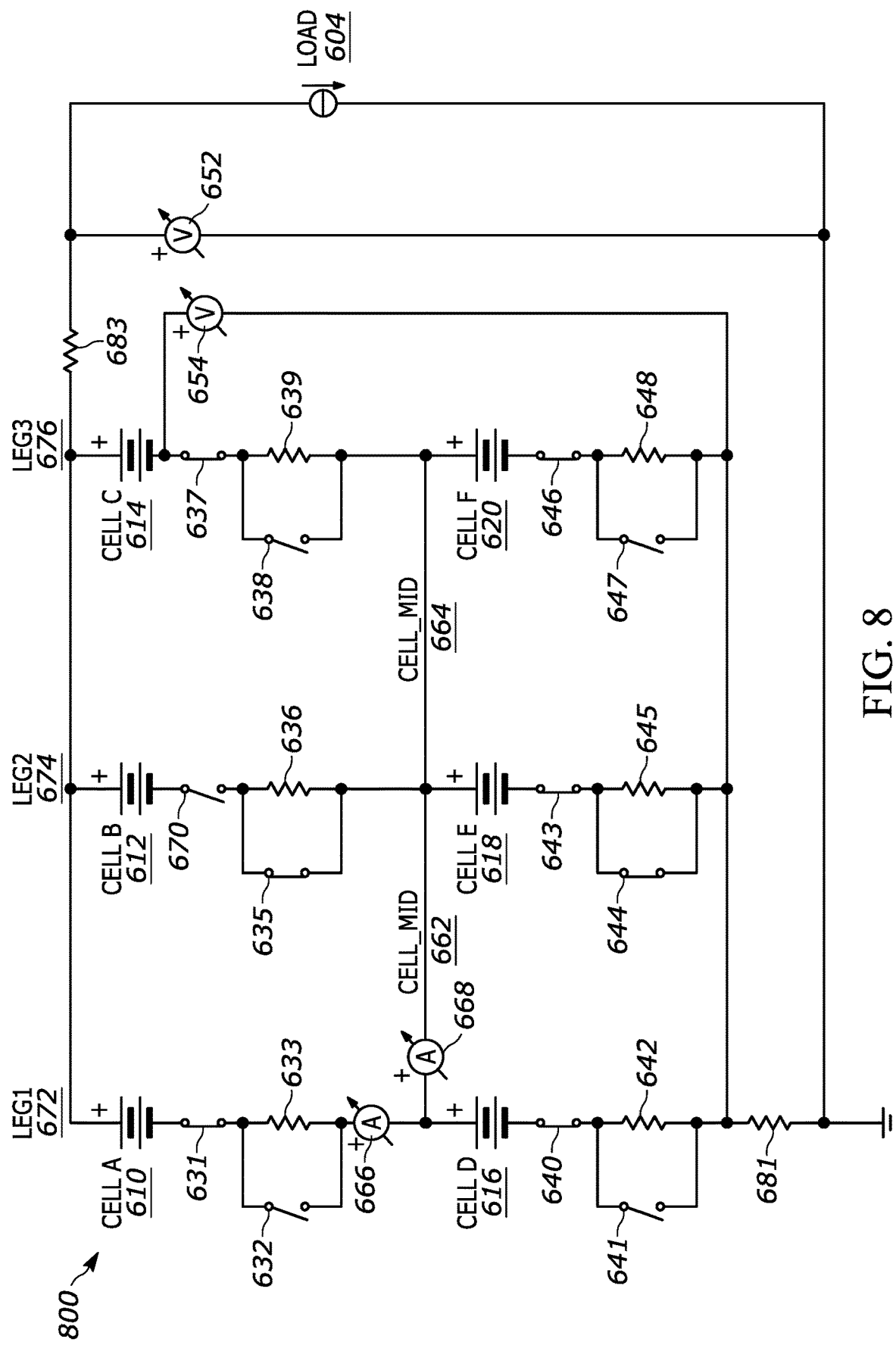
FIG. 8 is a schematic diagram illustrating a simulation of the detection of an open circuit fault condition in a battery pack including three cell paths, in accordance with some embodiments.

FIG. 8 is a schematic diagram 800 illustrating a simulation of the detection of an open circuit fault condition in a battery pack including three cell paths, in accordance with some embodiments. More specifically, diagram 800 illustrates the detection of an open circuit fault condition at cell B (612) in the simulation model 700 illustrated in FIG. 7 and described above. In this example, an open circuit fault condition is simulated at 670, with fuse 634 in an open state. While the simulation components are configured in the illustrated manner, a simulated constant current test load 604 of 500 mA is applied across the terminals of the battery pack and the pack output voltage is measured at voltmeter 652 as 7.02 V, representing a voltage drop of 0.58 V due to the application of test load 604. With the test load 604 applied, the voltage at voltmeter 654 is 3.27 V, representing a voltage drop of 0.53 V due to the application of test load 604. With the test load 604 applied and the open circuit fault condition present, the current at ammeter 666 is −250 mA and the current at ammeter 668 is −236.24 mA. In this example, the detected drop in the pack output voltage of 0.58 V, with a margin of 0.48 V over the threshold voltage drop of 0.1 V for the pack output voltage, indicates the presence of an open circuit fault condition in the battery pack with sufficient margin to be used in a production test or a fielded battery pack with the disclosed open cell detection system.

The simulation model 700 shown in FIG. 7 may be used to simulate open circuit faults at each of the other cells in the battery pack with similar results. For example, simulation model 700 may be used to simulate the detection of an open circuit fault condition at cell E (618). In this example, an open circuit fault condition is simulated by putting fuse 643 in an open state. While the simulation components are configured in the illustrated manner, a simulated constant current test load 604 of 500 mA is applied across the terminals of the battery pack and the pack output voltage is again measured at voltmeter 652 as 7.02 V, representing a voltage drop of 0.58 V due to the application of test load 604. With the test load 604 applied, the voltage at voltmeter 654 is 3.26 V, representing a voltage drop of 0.54 V due to the application of test load 604. With the test load 604 applied and the open circuit fault condition present, the current at ammeter 666 is −13.76 mA and the current at ammeter 668 is −235.24 mA. In this example, the detected drop in the pack output voltage of 0.58 V, with a margin of 0.48 V over the threshold voltage drop of 0.1 V for the pack output voltage, indicates the presence of an open circuit fault condition in the battery pack with sufficient margin to be used in production.

In another example, simulation model 700 may be used to simulate the detection of open circuit fault conditions at cell B (612) and cell E (618), both of which are in leg2 of the battery pack. In this example, the open circuit fault conditions are simulated by putting fuses 634 and 643 in an open state. While the simulation components are configured in the illustrated manner, a simulated constant current test load 604 of 500 mA is applied across the terminals of the battery pack and the pack output voltage is measured at voltmeter 652 as 6.53 V, representing a voltage drop of 1.07 V due to the application of test load 604. With the test load 604 applied, the voltage at voltmeter 654 is 2.78 V, representing a voltage drop of 1.02 V due to the application of test load 604. With the test load 604 applied and the open circuit fault condition present, the current at ammeter 666 is −250 mA and the current at ammeter 668 is −2.81 fA (zero A). In this example, the large detected drop in the pack output voltage of 1.07 V, with a margin of 1.06 V over the threshold voltage drop of 0.1 V for the pack output voltage, indicates the presence of an open circuit fault condition in the battery pack with sufficient margin to be used in production test or fielded product. In this example, even though both cells in leg2 experienced open circuit fault conditions, the battery output voltage was stable when the specified current load was applied.

Figure 9:
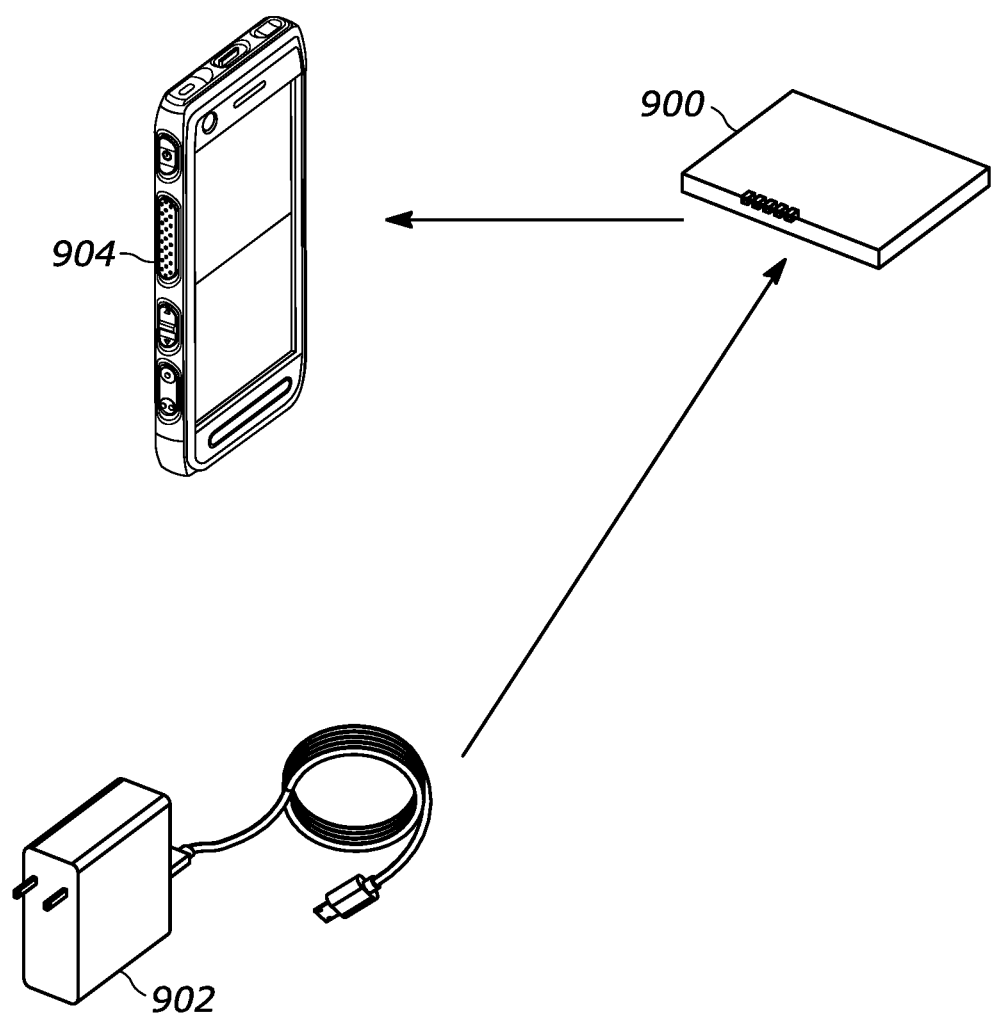
FIG. 9 is a block diagram illustrating a system including a portable electronic device and configured for detecting open circuit fault conditions, in accordance with some embodiments.

FIG. 9 is a block diagram illustrating a system that includes a portable electronic device and is configured for detecting open circuit fault conditions, in accordance with some embodiments. In the illustrated example, the system includes a battery 900, a charger 902 and a portable electronic device 904 which, in this case, is a communication device. In accordance with some embodiments, the battery 900 may be charged by the charger 902 and may discharge to power the communications device 904. The battery 900 shown in FIG. 9 may include any or all portions of the battery packs described elsewhere in this disclosure, such as the example embodiments described in reference to FIGS. 1 through 8 and FIGS. 10 through 13.

In accordance with some embodiments, if an open circuit fault condition is detected while the battery 900 is coupled to the power supply 902, the battery 900 may interrupt a thermistor within the battery 900 to simulate a fault condition in which the battery has reached an outer temperature limit. Similarly, if a fault condition is detected while the battery 900 is coupled to the communications device 904, the battery 900 may interrupt a thermistor within the battery 900 to simulate the over-temperature condition. The simulated condition may be detected by the battery 900, the power supply 902, the communications device 904, or a combination thereof.

In accordance with some embodiments, if an open circuit fault condition is detected while the battery 900 is coupled to the power supply 902, the battery 900 may flag itself as faulty. In accordance with some embodiments, if an open circuit fault condition is detected while the battery 900 is coupled to the communications device 904, the battery 900 may flag itself as faulty. In accordance with some embodiments, the battery 900 may be flagged as faulty in a local memory in the battery 900, a latch in the battery 900, or both. In accordance with some embodiments, if an open circuit fault condition is detected while the battery 900 is not coupled to the power supply 902 or the communications device 904, the battery 900 may flag itself as faulty.

In accordance with some embodiments, if the battery 900 is flagged as faulty, the power supply 902 may prevent or disable charging of the battery 900 when the power supply 902 is coupled to the battery 900. In accordance with some embodiments, if the battery 900 is flagged as faulty, the power supply 902 may allow itself to continue to charge the battery 900 but may do so using a reduced charge current to avoid damaging the battery. In accordance with some embodiments, if the battery 900 is flagged as faulty, the communications device 904 may allow the battery 900 to continue to discharge into the communications device 904 to power the communications device 904. In accordance with some embodiments, if the battery 900 is flagged as faulty, the communications device 904 may prevent or disable the battery 900 from discharging into the communications device 904 to power the communications device 904. In accordance with some embodiments, if the battery 900 is flagged as faulty, the battery 900 may allow the battery 900 to continue to discharge into the communications device 904 to power the communications device 904. In accordance with some embodiments, if the battery 900 is flagged as faulty, the battery 900 may prevent or disable the battery 900 from discharging into the communications device 904 to power the communications device 904.

As described herein, in some embodiments, a test circuit implemented in a battery pack, in an element of a portable electronic device other than the battery pack, or in a charger electrically connected to a portable electronic device that includes the battery pack, may be configured to provide digital control signals to open and close various FETs, to apply a test load to the battery pack terminals, and to obtain voltage measurements at the single voltage measurement test point in the battery pack. In various embodiments, the test circuit may include a processor and a memory storing instructions that when executed by the processor cause the processor to perform these and other operations, or a hardware state machine, such as a state machine implemented in field programmable gate arrays (FPGA), configured to perform the operations. For example, in some embodiments, the disclosed techniques for detecting open circuit fault conditions in a battery pack including parallel cells may be implemented as a microprocessor based self-diagnostic capability, with the microprocessor residing in the battery pack, in a charger for the battery pack, or on an electronic device powered by the battery pack. The microprocessor may have the ability to read the pack output voltage and to provide output control bits for each parallel cell path of the battery pack.

In some embodiments, an optimal location for the microprocessor may be in a charger that has the ability to apply a load. In this case, coordination between applying the test load and reading the pack output voltage may be handled by an integrated process control algorithm. In various embodiments, the charger may have the capability to supply output control bits to the battery pack directly or via a special communication interface so that the FETs for each parallel leg of the battery pack can be individually activated.

Figure 10:
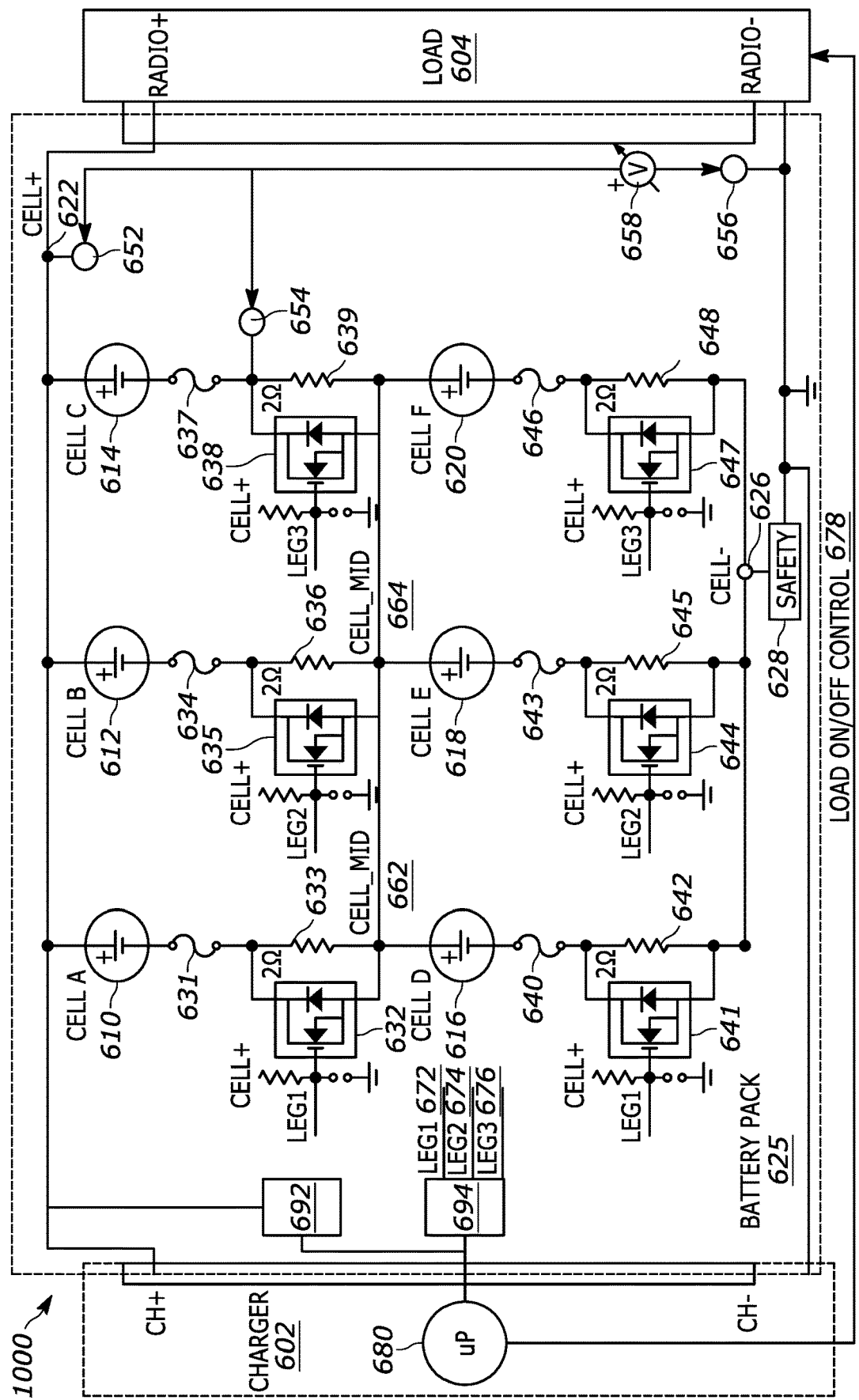
FIG. 10 is a block diagram illustrating selected elements of system comprising an example battery pack including three cell paths and a test circuit within a charger for indirect control of open circuit fault condition testing, in accordance with some embodiments.

FIG. 10 is a block diagram illustrating selected elements of system 1000 comprising an example battery pack including three cell paths and a test circuit within a charger for indirect control of open circuit fault condition testing, in accordance with some embodiments. More specifically, charger 602 includes a microprocessor 680 configured to implement some or all of the functionality of the test circuits described herein. In some embodiments, charger 602 may be a desktop charger into which battery pack 625 is inserted or to which battery pack is connected for charging. In the illustrated example, the battery pack 625 is similar to battery pack 625 illustrated in FIG. 6. In addition to the elements of battery pack 625 illustrated in FIG. 6, FIG. 10 illustrates, within battery pack 625, a fuel gauge 692 and a controller 694. In some embodiments, cell positive may be measured by fuel gauge 692. As shown in FIG. 10, controller 694 may, in accordance with instructions, control signals, or other input received from microprocessor 680, output programmable Input/Output (PIO) signals representing FET switching signals 672, 674, and 676 to open and close various ones of the FETs during open circuit fault testing, as described herein. In some embodiments, microprocessor 680 may provide instructions, control signals, or other input to controller 694 using 1-Wire® technology developed by Maxim Integrated Products, Inc. In some embodiments, microprocessor 680 may also generate control signal 678, enabling a charger switchable constant current load. In some embodiments, a 1-Wire interface may also be used to make CELL+ voltage measurements from the fuel gauge. In other embodiments, microprocessor 680 may use another suitable interface technology to provide instructions, control signals, or other input to controller 694 or to provide control signal 678.

In various embodiments, the process control algorithm implemented by microprocessor 680 may include the following operations: 1) disable the load, 2) enable only one of the parallel legs, 3) measure the voltage at the test point while unloaded, 4) apply a test load, 5) take a small time delay, 6) measure the voltage at the test point while loaded, 7) determine whether the unloaded voltage measurement minus the loaded voltage measurement exceeds a voltage drop threshold, which would indicate the presence of an open circuit fault condition, 8) repeat steps 1 through 7 for each additional parallel leg in the battery pack.

Figure 11:
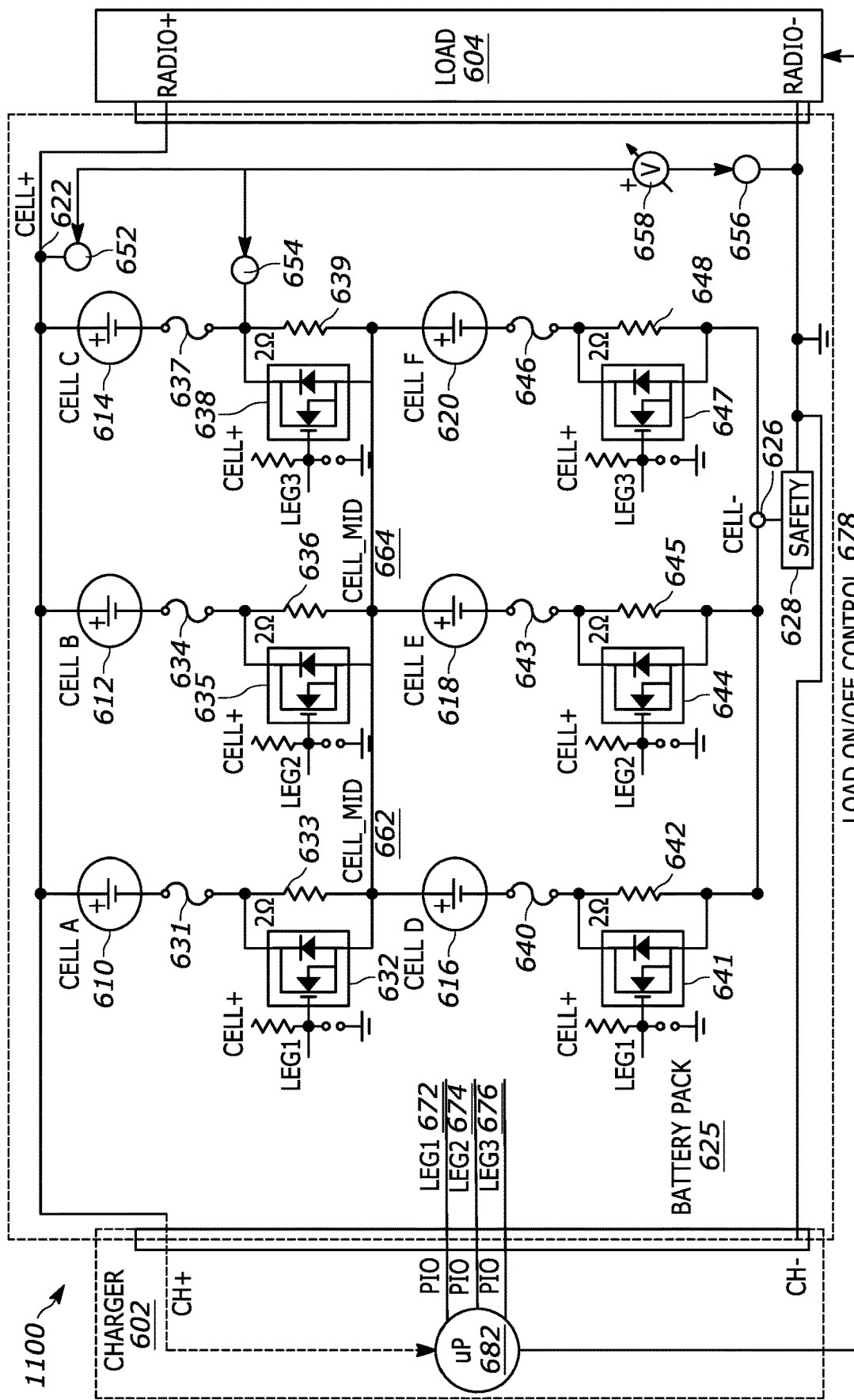
FIG. 11 is a block diagram illustrating selected elements of system comprising an example battery pack including three cell paths and a test circuit within a charger for direct control of open circuit fault condition testing, in accordance with some embodiments.

FIG. 11 is a block diagram illustrating selected elements of system 1100 comprising an example battery pack including three cell paths and a test circuit within a charger for direct control of open circuit fault condition testing, in accordance with some embodiments. More specifically, charger 602 includes a microprocessor 682 configured to implement some or all of the functionality of the test circuits described herein. In some embodiments, charger 602 may be a desktop charger into which battery pack 625 is inserted or to which battery pack is connected for charging. In the illustrated example, the battery pack 625 is similar to battery pack 625 illustrated in FIG. 6. In this example, microprocessor 682 outputs programmable Input/Output (PIO) signals representing FET switching signals 672, 674, and 676 directly to battery pack 625 to open and close various ones of the FETs during open circuit fault testing, as described herein. In this example, microprocessor 682 may also generate control signal 678, enabling a charger switchable constant current load. In this example, cell positive may be measured at the positive terminal of charger 602, shown as CH+.

Figure 12:
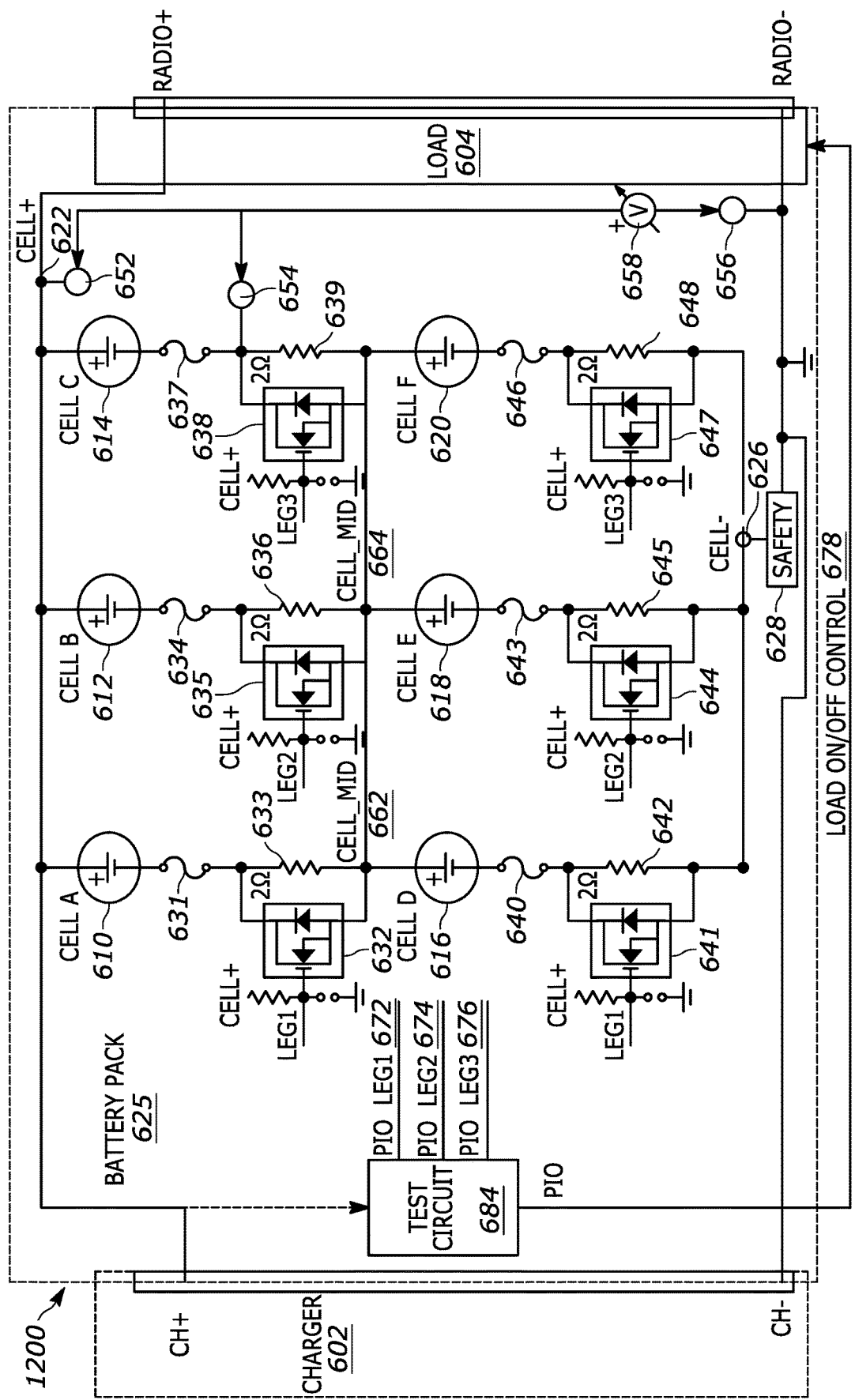
FIG. 12 is a block diagram illustrating selected elements of system comprising an example battery pack including three cell paths and a test circuit within the battery pack configured for open circuit fault condition testing, in accordance with some embodiments.

FIG. 12 is a block diagram illustrating selected elements of system 1200 comprising an example battery pack including three cell paths and a test circuit 684 within the battery pack configured for open circuit fault condition testing, in accordance with some embodiments. In the illustrated example, the battery pack 625 is similar to battery pack 625 illustrated in FIG. 6. In some embodiments, test circuit 684 may include a processor and a memory storing instructions that when executed by the processor cause the processor to perform the operations described herein for detecting open circuit fault conditions in a battery pack with parallel cells. In other embodiments, test circuit 684 may be or include a hardware state machine configured to perform the operations described herein for detecting open circuit fault conditions in a battery pack with parallel cells. For example, in some embodiments, test circuit 684 may include a state machine implemented in an FPGA. In this example, test circuit 684 outputs programmable Input/Output (PIO) signals representing FET switching signals 672, 674, and 676 to open and close various ones of the FETs during open circuit fault testing, as described herein. In this example, test circuit 684 may also generate control signal 678, enabling a battery switchable constant current load. In this example, cell positive may be measured by test circuit 684, such as by a microprocessor or by a hardware A/D convertor within test circuit 684.

Figure 13:
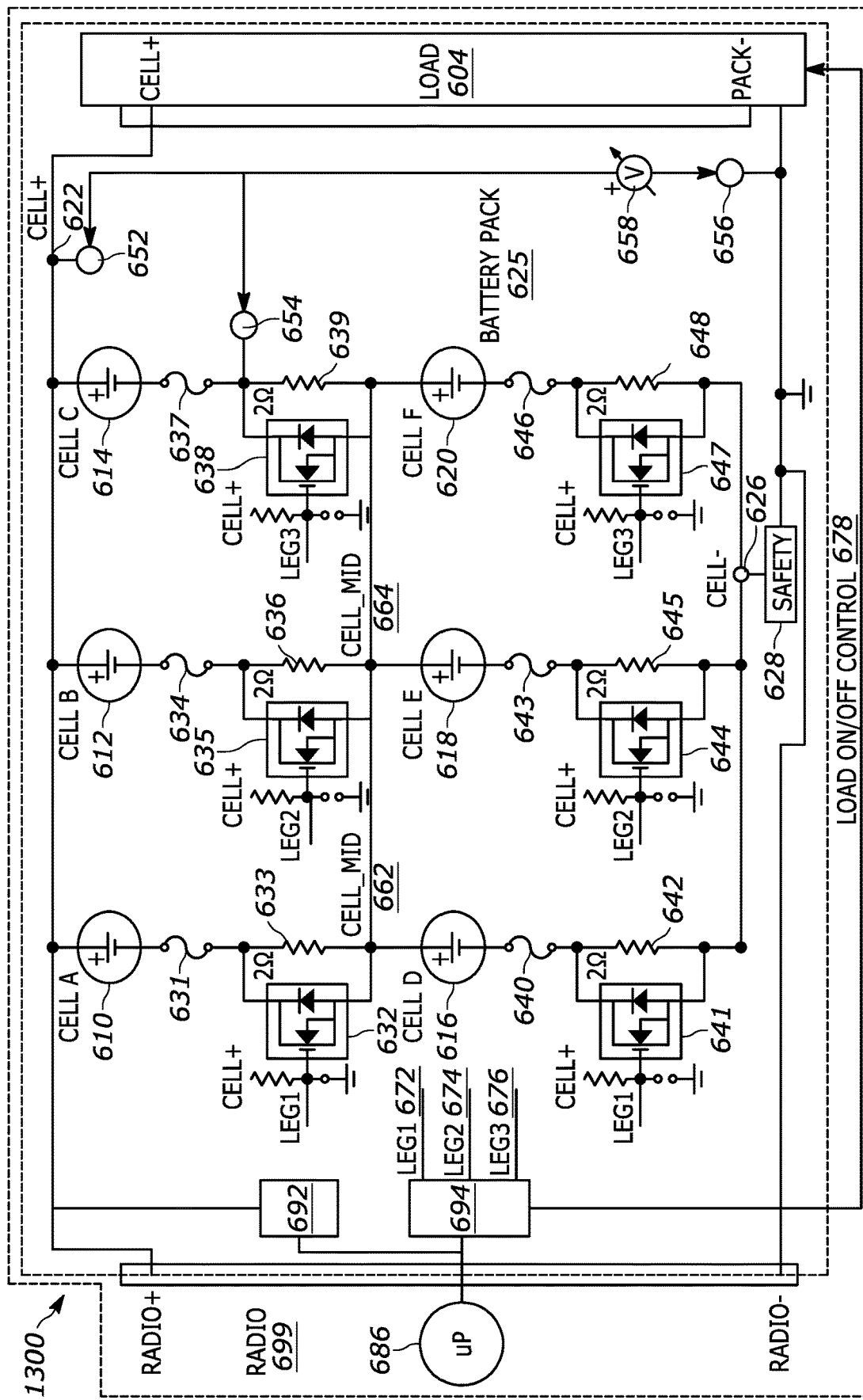
FIG. 13 is a block diagram illustrating selected elements of system comprising an example battery pack for a portable electronic device including three cell paths and a test circuit within the portable electronic device configured for open circuit fault condition testing, in accordance with some embodiments.

FIG. 13 is a block diagram illustrating selected elements of system 1300 comprising an example battery pack for a portable electronic device including three cell paths and a test circuit within the portable electronic device, e.g., a radio, configured for open circuit fault condition testing, in accordance with some embodiments. More specifically, radio 699 includes a microprocessor 686 configured to implement some or all of the functionality of the test circuits described herein. In the illustrated example, the battery pack 625 is similar to battery pack 625 illustrated in FIG. 6. In addition to the elements of battery pack 625 illustrated in FIG. 6, FIG. 13 illustrates, within battery pack 625, a fuel gauge 692 and a controller 694. In some embodiments, cell positive may be measured by fuel gauge 692. As shown in FIG. 13, controller 694 may, in accordance with instructions, control signals, or other input received from microprocessor 686, output programmable Input/Output (PIO) signals representing FET switching signals 672, 674, and 676 to open and close various ones of the FETs during open circuit fault testing, as described herein. In some embodiments, controller 694, in accordance with instructions, control signals, or other input received from microprocessor 686, may also generate control signal 678, enabling a switchable constant current load. In some embodiments, microprocessor 686 may provide instructions, control signals, or other input to controller 694 over a 1-Wire interface. In some embodiments, a 1-Wire interface may also be used to make CELL+ voltage measurements from the fuel gauge. In other embodiments, microprocessor 680 may use another suitable interface technology to provide instructions, control signals, or other input to controller 694 or to provide control signal 678.

Figure 14:
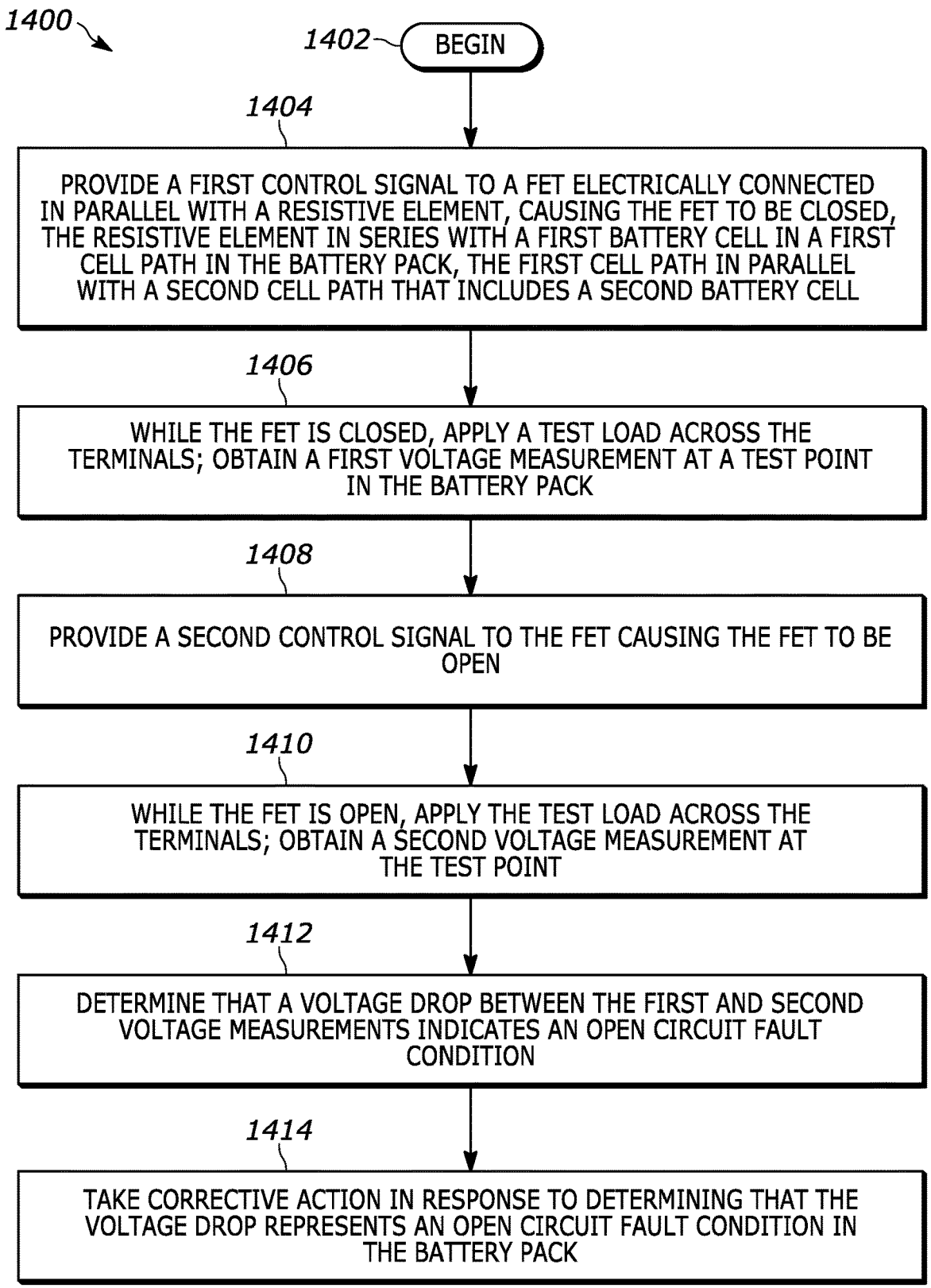
FIG. 14 is a flowchart illustrating selected elements of an example method for detecting open circuit fault conditions in a battery pack comprising respective battery cells in two parallel cell paths, in accordance with some embodiments.

Referring now to FIG. 14, there is provided a flowchart illustrating selected elements of an example method 1400 for detecting open circuit fault conditions in a battery pack comprising respective battery cells in two parallel cell paths, in accordance with some embodiments. In at least some embodiments, some or all of the operations shown in FIG. 14 may be performed by a test circuit implemented in the battery pack, in an element of a portable electronic device other than the battery pack, or in a charger electrically connected to a portable electronic device that includes a battery pack. In various embodiments, the test circuit may include a processor and a memory storing instructions that when executed by the processor cause the processor to perform the operations, or a hardware state machine configured to perform the operations. While a particular order of operations is indicated in FIG. 14 for illustrative purposes, the timing and ordering of such operations may vary where appropriate without negating the purpose and advantages of the examples set forth in detail throughout the remainder of this disclosure.

In this example embodiment, method 1400 begins with block 1402 in FIG. 14 and continues with block 1404 where a first control signal is provided to a FET electrically connected in parallel with a resistive element, causing the FET to be closed and shorting across the resistive element. The resistive element is in series with a first battery cell in a first cell path between the positive and negative terminals of the battery pack, and the first cell path in parallel with a second cell path between the positive and negative terminals of the battery pack that includes a second battery cell. In some embodiments, the battery cells may be of the same cell type and have the same impedance. In other embodiments, the batteries may be of different cells types or may have different impedances. In one example, the battery pack may include a single cylindrical cell in parallel with a single prismatic cell in a 1S2P configuration, similar to battery pack 120 illustrated in FIG. 1. In another example, the battery pack may include two cylindrical cells in series that are in parallel with two prismatic cells in series, in accordance with a 2S2P topology. In various embodiments, when a battery pack includes battery cells of different cell types having different impedances, the resistance values added in series with each battery cell may be selected such that the impedance of the battery cell matches or exceeds the impedance of one or more other battery cells in the battery pack.

At block 1406, the method includes, while the FET is closed, applying a test load across the positive and negative terminals of the battery pack and obtaining a first voltage measurement at a test point in the battery pack. In one example, the test load may have a constant current of 4 amps.

Method 1400 includes, at 1408, providing a second control signal to the FET causing the FET to be open, thus removing the short across the resistive element.

At 1410, the method includes, while the FET is open, applying, or re-applying, the test load across the positive and negative terminals of the battery pack and obtaining a second voltage measurement at the test point.

At 1412, method 1400 includes determining that a voltage drop between the first and second voltage measurements is indicative of an open circuit fault condition. In at least some embodiments, the location of the open circuit fault condition may be determined based on the magnitude of the voltage drop. In at least some embodiments, the open circuit fault condition may be or include an open fuse in the second cell path, an open connection in the second cell path, or a malfunction of the second battery cell.

At 1414, the method includes taking corrective action in response to determining that the voltage drop represents an open circuit fault condition in the battery pack. For example, taking corrective action may include one or more of providing an indication that the open circuit fault condition has been detected in the battery pack, selecting a charging current to be used in charging the battery pack dependent on the detected open circuit fault condition, and refraining from charging the battery pack while the open circuit fault condition persists. In some embodiments, in response to detecting an open circuit fault condition in the battery pack, the method may allow the portable electronic device, charger, or both to disable charging to prevent one or more cells in the battery from charging beyond a desired rate. For example, in response to detecting an open circuit fault condition, a fault signal may be generated on a data line of the battery pack indicating that at least a first cell of the battery pack has been compromised. In accordance with some embodiments, taking corrective action may include interrupting a thermistor by activating a switch coupled to a decoder coupled to the data line, thereby simulating that the temperature of at least a portion of the battery has reached an outer limit. In some embodiments, interrupting the thermistor may include shorting the thermistor. In some embodiments, interrupting the thermistor may include opening the thermistor.

Figure 15:
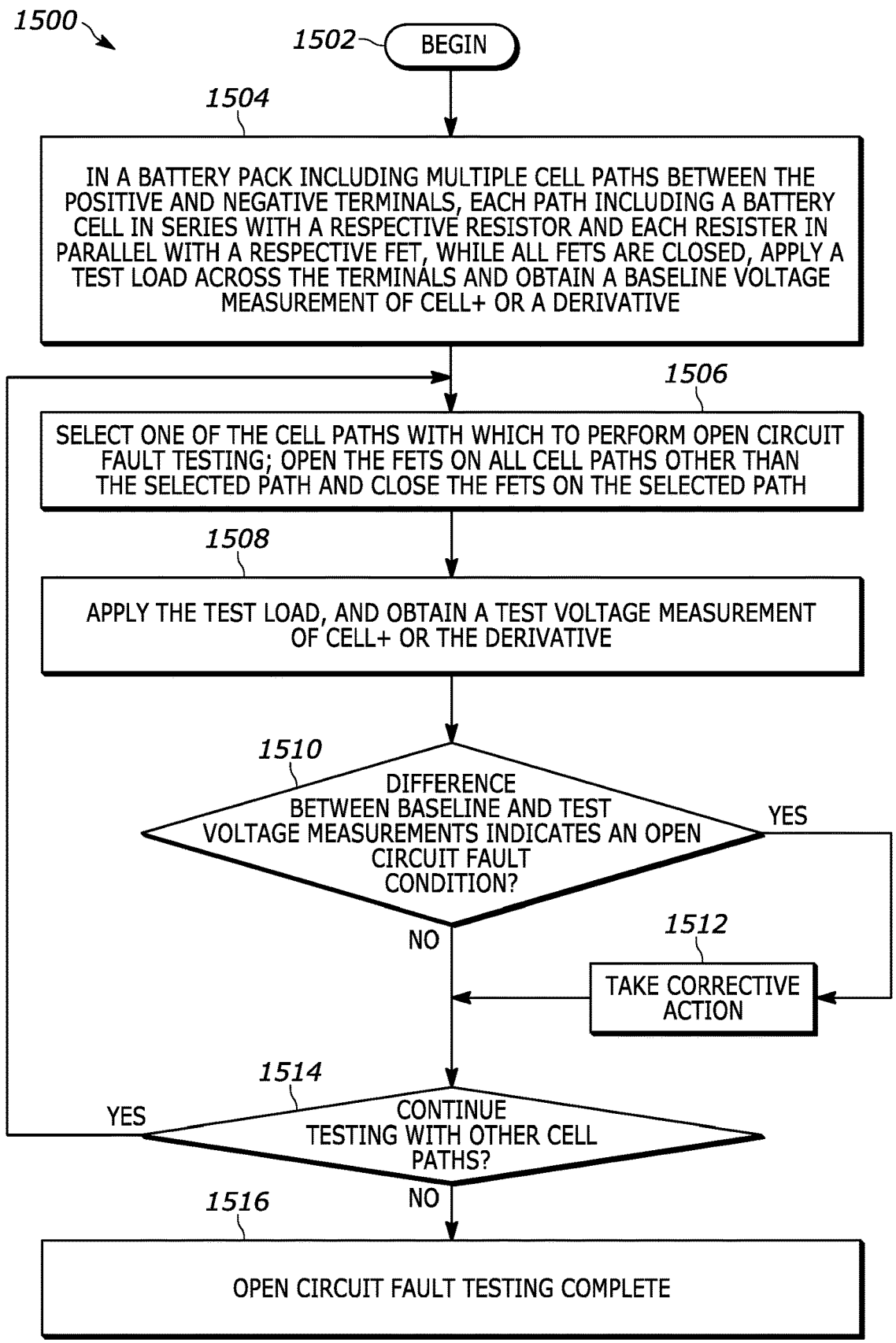
FIG. 15 is a flowchart illustrating selected elements of an example method for detecting open circuit fault conditions in a battery pack comprising multiple cell paths by testing each cell path in sequence, in accordance with some embodiments.

Referring now to FIG. 15, there is provided a flowchart illustrating selected elements of an example method 1500 for detecting open circuit fault conditions in a battery pack comprising multiple cell paths by testing each cell path in sequence, in accordance with some embodiments. In at least some embodiments, some or all of the operations shown in FIG. 15 may be performed by a test circuit implemented in the battery pack, in an element of a portable electronic device other than the battery pack, or in a charger electrically connected to a portable electronic device that includes a battery pack. In various embodiments, the test circuit may include a processor and a memory storing instructions that when executed by the processor cause the processor to perform the operations, or a hardware state machine configured to perform the operations. While a particular order of operations is indicated in FIG. 15 for illustrative purposes, the timing and ordering of such operations may vary where appropriate without negating the purpose and advantages of the examples set forth in detail throughout the remainder of this disclosure.

In the example embodiment illustrated in FIG. 15, method 1500 begins with block 1502 and continues with block 1504, in which, in a battery pack including multiple cell paths between the positive and negative terminals, each path including a battery cell electrically connected in series with a respective resistor and each resistor being electrically connected in parallel with a respective FET, while all FETs are closed, a test load is applied across the positive and negative terminals of the battery pack and a baseline measurement of the output voltage of the battery pack (Cell+) or a derivative thereof, is obtained. In some embodiments, each of the multiple cell paths may include multiple battery cells in series. In various embodiments, the battery cells in each cell path may be of the same cell type and have the same impedance or may be of two or more different cells types or have different impedances. In some embodiments, only the battery cell, or battery cells, in one cell path are electrically connected in series with a respective resistive element that is electrically connected in parallel with a respective FET. In other embodiments, each battery cell in each cell path is electrically connected in series with a respective resistive element that is electrically connected in parallel with a respective FET.

At 1506, the method includes selecting a first one of the cell paths with which to perform open circuit fault testing, opening the FETs on all cell paths other than the selected cell path, and closing the FETs on the selected cell path.

Method 1500 includes, at 1508, applying, or re-applying, the test load and obtaining a test measurement of the output voltage of the battery pack (Cell+) or the derivative thereof.

If, at block 1510, it is determined that the difference between the baseline voltage measurement and the test voltage measurement is indicative of an open circuit fault condition in the battery pack, method 1500 may continue at 1512 before proceeding to 1514. Otherwise, the method may proceed directly to 1514. In at least some embodiments, the location of a detected open circuit fault condition may be determined based on the magnitude of the difference between the baseline voltage measurement and the test voltage measurement. In various embodiments, the open circuit fault condition may be or include an open fuse in the second cell path, an open connection in the second cell path, or a malfunction of the second battery cell.

At 1512, the method includes taking corrective action in response to determining that the test voltage measurement is indicative of an open circuit fault condition. For example, taking corrective action may include one or more of providing an indication that the open circuit fault condition has been detected in the battery pack, selecting a charging current to be used in charging the battery pack dependent on the detected open circuit fault condition, and refraining from charging the battery pack while the open circuit fault condition persists.

If, at block 1514, it is determined that testing should continue with one or more additional cell paths, method 1500 may return to 1506, after which the operations shown as 1506 through 1512 may be repeated, as appropriate, to conduct open circuit fault testing with one or more additional cell paths or portions thereof. For example, in some embodiments, once an open circuit fault condition in one cell path or associated with one battery cell has been detected, the test circuit may refrain from performing any additional open circuit fault testing. In other embodiments, the test circuit may perform open circuit fault testing with each cell path in sequence until testing with all cells has been completed.

If, or once, it is determined at 1514 that the open circuit fault testing should not continue, the method may proceed to 1516, where the open circuit fault testing is complete.

Figure 16:
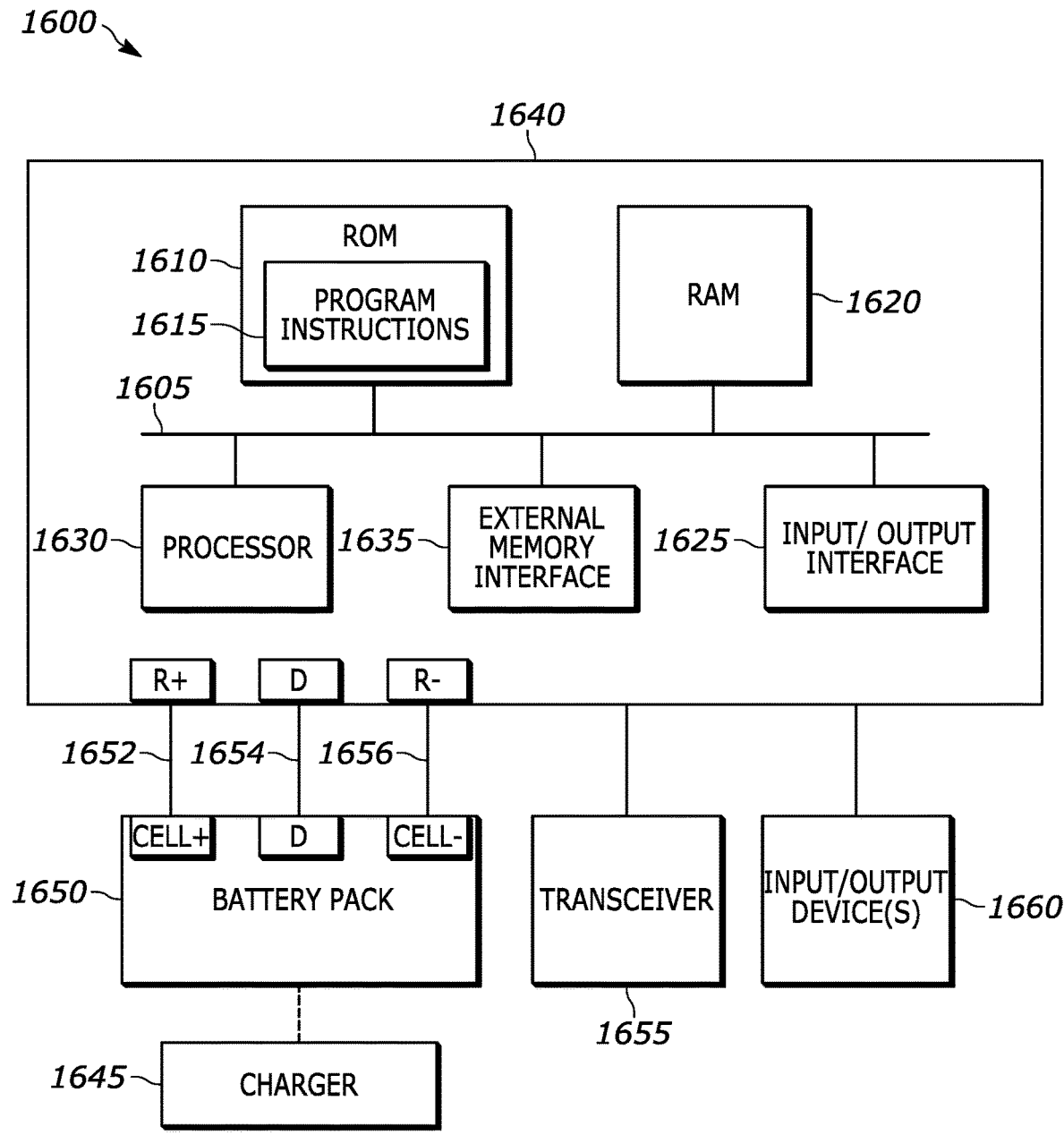
FIG. 16 is a block diagram illustrating selected elements of an example electronic device including a battery pack containing parallel battery cells and a host processing unit, in accordance with some embodiments.

Referring now to FIG. 16, there is provided a block diagram illustrating selected elements of an example electronic device 1600 including a battery pack 1650 containing battery cells in parallel, some of which may be of disparate types, and a host processing unit 1640, in accordance with some embodiments. Electronic device 1600 may be any type of electronic device for which power can be supplied, at least at certain times, by battery pack 1650. At certain times, battery pack 1650 may be coupled to a charger 1645 to charge the battery cells of battery pack 1650, as described herein. Charger 1645 may be similar to charger 102 illustrated in FIGS. 1, 2, and 3, or charger 602 illustrated in FIGS. 6, 10, 11, and 12, in some embodiments. In some embodiments, electronic device 1600 may be a portable electronic device such as a multifunction radio, a mobile telephone, a laptop computer, a tablet computer, a smart phone, a lighting system, a sound system, or another type of portable electronic device.

Battery pack 1650, or another element of electronic device 1600, may include circuitry or logic for detecting an open circuit fault condition in a battery pack containing parallel cells, as described herein. For example, a test circuit implemented in battery pack 1650 or elsewhere in electronic device 1600 may include circuitry or logic for performing any of the methods described herein for detecting an open circuit fault in a battery pack containing parallel cells. In other embodiments, the test circuit may be implemented in charger 1645. In various embodiments, battery pack 1650 may be similar to battery pack 120 illustrated in FIG. 1, battery pack 220 illustrated in FIGS. 2 and 3, or battery pack 625 illustrated in FIGS. 6, 10, 11, 12, and 12, and may provide power to host processing unit 1640 over a load path defined collectively by the paths 1652 and 1656 between the terminals (Cell+ and Cell-) of battery pack 1650 and the terminals (R+ and R-) of host processing unit 1640 as the load. Battery pack 1650 may also send data to or receive data from host processing unit 1640 over one or more data lines 1654, in some embodiments. In some embodiments, a digital signal indicating a current or voltage measurement taken within battery pack 1650 may be provided to processor 1630 of host processing unit 1640 over data lines 1654. In response to receiving the digital signal, the processor 1630 may take actions to address issues such as a discharge over-current or short circuit condition. In some embodiments, host processing unit 1640 may be operable to perform power management tasks. For example, host processing unit 1640 may be operable to take corrective action in response to detecting an open circuit fault condition in battery pack 1650, such as reducing the charging current to be used in charging battery pack 1650 dependent on the detected open circuit fault condition or preventing the charging of battery pack 1650 while the open circuit fault condition persists.

In some embodiments, host processing unit 1640 may obtain one or more operating parameters of battery pack 1650, or of particular battery cells thereof, over data lines 1654. In some embodiments, the operating parameters of the battery pack, or of a particular battery cell, may be read from a memory within battery pack 1650 that stores battery data by host processing unit 1640 (not shown). The operating parameters of the battery pack or cell obtained by host processing unit 1640 may include, but are not limited to, a state-of-charge of the battery pack or a battery cell thereof, one or more battery cell types, a battery pack or battery cell topology, the available capacity of the battery pack or a battery cell thereof, a peak charging capacity of the battery pack or a battery cell thereof, a present charging capacity of the battery pack or a battery cell thereof, a nominal voltage range for the battery pack or a battery cell thereof, the temperature of the battery pack or a battery cell thereof, an indication of the age of the battery pack or a battery cell thereof, the number of charge-discharge cycles the battery pack or battery cell has experienced, or a measure of impedance for the battery pack or a battery cell thereof. In some embodiments, a power management function operating on the host processing unit 1640 may be able to read these or other values from the memory.

As illustrated in this example embodiment, host processing unit 1640 may include a Read Only Memory (ROM) 1610, a Random Access Memory (RAM) 1620, an electronic processor 1630, an input/output interface 1625, and an external memory interface 1635, all of which are coupled to a system bus 1605 through which they communicate with each other. In various embodiments, electronic processor 1630 may include a microprocessor, a microcontroller, a system-on-chip, a field-programmable gate array, a programmable mixed-signal array or, in general, any system or sub-system that includes nominal memory and that is capable of executing a sequence of instructions in order to control hardware elements of electronic device 1600.

In this example embodiment, ROM 1610 stores program instructions 1615, at least some of which may be executed by electronic processor 1630 to perform the methods described herein. For example, some of the operations of method 1400 illustrated in FIG. 14 or method 1500 illustrated in FIG. 15 may be performed by program instructions executing on host processing unit 1640. In some embodiments, program instructions 1615 may include program instructions that when executed on host processing unit 1640 implement other functionality features of electronic device 1600. In some embodiments, program instructions 1615 may be stored in another type of non-volatile memory, such as a hard disk, a CD-ROM, an optical storage device, a magnetic storage device, a PROM (Programmable Read Only Memory), an EPROM (Erasable Programmable Read Only Memory), an EEPROM (Electrically Erasable Programmable Read Only Memory) or a Flash memory. In this example embodiment, RAM 1620 may, from time to time, store data representing battery data or operating parameters of battery pack 1650, or of particular battery cells thereof, to be used in detecting an open circuit fault condition in battery pack 1650, as described herein, or in performing other power management functions on behalf of electronic device 1600. In some embodiments, RAM 1620 may also store data used in performing other functions of the electronic device 1600.

In this example embodiment, input/output interface 1625 may include one or more analog input interfaces, such as one or more A/D convertors, or digital interfaces for receiving signals or data representing battery data or operating parameters of battery pack 1650 or of particular battery cells thereof. Input/output interface 1625 may also include interfaces through which host processing unit 1640 may be coupled to other elements of electronic device 1600. For example, host processing unit 1640 may be coupled to input/output devices that implement other functionality features of electronic device 1600, such as a keyboard, a mouse, a touch panel, a switch, a microphone, a video camera, a display, a speaker, one or more sensors, and the like over input/output interface 1625. In the illustrated example, host processing unit 1640 is shown coupled to a transceiver 1655 and one or more input/output devices 1660.

External memory interface 1635 may include one or more interfaces through which host processing unit 1640 may be coupled to an external memory (not shown in FIG. 16). Such an external memory may include, for example, a hard-disk drive (HDD), an optical disk drive such as a compact disk (CD) drive or digital versatile disk (DVD) drive, a solid-state drive (SSD), a tape drive, a flash memory drive, or a tape drive, to name a few.

While several example embodiments described herein include a battery pack having a 1S2P configuration, a 2S2P configuration, or a 2S3P configuration, in other embodiments battery cells of the same or disparate cells types may be arranged differently within a battery pack. For example, a battery pack may include battery cells in a 3S type configuration, such as a 3S2P configuration. In general, the techniques described herein may be used to detect open circuit fault conditions in battery packs containing parallel cells in which any number of parallel legs each having any number of cells are arranged in a parallel or parallel-series configuration.

While several example embodiments described herein include battery packs containing battery cells of different cell types that have the same battery chemistry, e.g., a Li-Ion chemistry, in other embodiments the disclosed techniques for detecting open circuit fault conditions in battery packs containing parallel cells may be applied to battery packs in which the battery cells have different battery chemistries but similar voltage profiles. In still other embodiments, the disclosed techniques for detecting open circuit fault conditions in battery packs containing parallel cells may be applied to battery packs in which the battery cells are of identical types and have identical characteristics, or to battery packs in which the battery cells are of the same cell type but have some disparate characteristics, such as different capacities.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element preceded by "comprises . . . a", "has . . . a", "includes . . . a", "contains ... a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way but may also be configured in ways that are not listed.

It will be appreciated that some embodiments may be comprised of one or more generic or specialized electronic processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer-readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and integrated circuits (ICs) with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of any single disclosed embodiment. Thus, the following claims are hereby incorporated into the Detailed Description, with each claim standing on its own as a separately claimed subject matter.

We claim:

1. A method for detecting an open circuit fault in a battery pack, comprising:
providing a first control signal to a first field-effect transistor (FET) electrically connected in parallel with a first resistive element, the first resistive element being in series with a first battery cell in a first cell path between positive and negative terminals of the battery pack, the first cell path being in parallel with a second cell path between the positive and negative terminals and comprising a second battery cell, and the first control signal causing the first FET to be closed to provide a short across the first resistive element;
while the first FET is closed:
applying a test load across the positive and negative terminals; and
obtaining a first voltage measurement at a test point in the battery pack;
providing a second control signal to the first FET causing the first FET to be open;
while the first FET is open:
applying the test load across the positive and negative terminals; and
obtaining a second voltage measurement at the test point;
determining that a voltage drop between the first voltage measurement and the second voltage measurement is indicative of an open circuit fault condition in the battery pack; and
determining a location of the open circuit fault condition dependent on a magnitude of the voltage drop between the first voltage measurement and the second voltage measurement.

2. The method of claim 1, wherein the open circuit fault condition comprises an open fuse in the second cell path, an open connection in the second cell path, or a malfunction of the second battery cell.

3. The method of claim 1, further comprising selecting the first resistive element dependent on a respective type or impedance of each of the first battery cell and the second battery cell.

4. The method of claim 1, further comprising, while the first FET is open, providing a third control signal to a second FET electrically connected in parallel with a second resistive element, the second resistive element being in series with the second battery cell in the second cell path, and the third control signal causing the second FET to be closed.

5. The method of claim 4, further comprising, subsequent to determining that the voltage drop between the first voltage measurement and the second voltage measurement is indicative of an open circuit fault condition in the battery pack:
providing a fourth control signal to the first FET causing the first FET to be closed;
providing a fifth control signal to the second FET causing the second FET to be open;
while the second FET is open:
applying the test load across the positive and negative terminals; and
obtaining a third voltage measurement at the test point; and
determining that a difference between the first voltage measurement and the third voltage measurement is not indicative of an open circuit fault condition in the battery pack.

6. The method of claim 1, wherein the test point comprises a location in the battery pack at which an output voltage for the battery pack or a derivative of the output voltage for the battery pack is measurable.

7. The method of claim 1, further comprising taking corrective action in response to determining that the voltage drop represents an open circuit fault condition in the battery pack, the corrective action comprising one or more of:
   providing an indication that the open circuit fault condition has been detected;
   selecting a charging current to be used in charging the battery pack dependent on the detected open circuit fault condition; and
   refraining from charging the battery pack while the open circuit fault condition persists.

8. A battery pack for an electronic device, comprising:
   a first cell path between a positive terminal of the battery pack and a negative terminal of the battery pack, the first cell path comprising:
      a first battery cell;
      a first resistive element electrically connected in series with the first battery cell; and
      a first field-effect transistor (FET) electrically connected in parallel with the first resistive element;
   a second cell path between the positive and negative terminals in parallel with the first cell path, the second cell path comprising a second battery cell; and
   a test circuit configured to:
      provide a first control signal to the first FET causing the first FET to be closed to provide a short across the first resistive element;
      while the first FET is closed:
         apply a test load across the positive and negative terminals; and
         obtain a first voltage measurement at a test point in the battery pack;
      provide a second control signal to the first FET causing the first FET to be open;
      while the first FET is open:
         apply the test load across the positive and negative terminals; and
         obtain a second voltage measurement at the test point;
      determine whether a voltage difference between the first voltage measurement and the second voltage measurement is indicative of an open circuit fault condition in the battery pack; and
      determine a location of the open circuit fault condition dependent on a magnitude of the voltage difference between the first voltage measurement and the second voltage measurement in response to a determination that the voltage difference between the first voltage measurement and the second voltage measurement is indicative of the open circuit fault condition in the battery pack.

9. The battery pack of claim 8, wherein:
   the first battery cell and the second battery cell are of different cell types or have different impedances; and
   the first resistive element is selected dependent on the cell types or the impedances of the first battery cell and the second battery cell.

10. The battery pack of claim 8, wherein:
    the battery pack further comprises a second FET electrically connected in parallel with a second resistive element, the second resistive element being in series with the second battery cell in the second cell path; and
    the test circuit is further configured to:
       while the first FET is open, provide a third control signal to the second FET causing the second FET to be closed; and
       subsequent to determining whether the voltage difference between the first voltage measurement and the second voltage measurement is indicative of an open circuit fault condition in the battery pack:
          provide a fourth control signal to the first FET causing the first FET to be closed;
          provide a fifth control signal to the second FET causing the second FET to be open;
          while the second FET is open:
             apply the test load across the positive and negative terminals; and
             obtain a third voltage measurement at the test point; and
          determine whether a voltage difference between the first voltage measurement and the third voltage measurement is indicative of an open circuit fault condition in the battery pack.

11. The battery pack of claim 10, wherein:
    the battery pack further comprises a third cell path between the positive and negative terminals in parallel with the first cell path and the second cell path, the third cell path comprising:
       a third battery cell;
       a third resistive element electrically connected in series with the third battery cell; and
       a third FET electrically connected in parallel with the third resistive element; and
    the test circuit is further configured to:
       while the first FET is open and while the second FET is open, provide a sixth control signal to the third FET causing the third FET to be closed; and
       subsequent to determining whether the voltage difference between the first voltage measurement and the second voltage measurement is indicative of an open circuit fault condition in the battery pack and determining whether a voltage difference between the first voltage measurement and the third voltage measurement is indicative of an open circuit fault condition in the battery pack:
          provide a seventh control signal to the first FET causing the first FET to be closed;
          provide an eighth control signal to the second FET causing the second FET to be closed;
          provide a ninth control signal to the third FET causing the third FET to be open;
          while the third FET is open:
             apply the test load across the positive and negative terminals; and
             obtain a fourth voltage measurement at the test point; and
          determine whether a voltage difference between the first voltage measurement and the fourth voltage measurement is indicative of an open circuit fault condition in the battery pack.

12. The battery pack of claim 8, wherein the test point comprises a location in the battery pack at which an output voltage for the battery pack or a derivative of the output voltage for the battery pack is measurable.

13. The battery pack of claim 8, wherein the test circuit comprises:
    a processor and a memory storing instructions that when executed by the processor cause the processor to provide the first and second control signals, apply the test load, obtain the first and second voltage measurements, and determine whether a voltage difference between the first voltage measurement and the second voltage measurement is indicative of an open circuit fault condition; or a hardware state machine configured to provide the first and second control signals, apply the test load, obtain the first and second voltage measurements, and determine whether a voltage difference between the first voltage measurement and the second voltage measurement is indicative of an open circuit fault condition.

14. The battery pack of claim 8, wherein:
the first cell path further comprises:
  a third battery cell electrically connected in series with the first battery cell;
  a third resistive element electrically connected in series with the third battery cell; and
  a third FET electrically connected in parallel with the third resistive element; and
the second cell path further comprises a fourth battery call electrically connected in series with the second battery cell.

15. A portable electronic device, comprising:
a battery pack; and
one or more electrical circuits powered by the battery pack;
wherein the battery pack comprises:
  a first cell path between a positive terminal of the battery pack and a negative terminal of the battery pack, the first cell path comprising:
    a first battery cell;
    a first resistive element electrically connected in series with the first battery cell; and
    a first field-effect transistor (FET) electrically connected in parallel with the first resistive element;
  a second cell path between the positive and negative terminals in parallel with the first cell path, the second cell path comprising a second battery cell; and
  a test circuit configured to:
    provide a first control signal to the first FET causing the first FET to be closed to provide a short across the first resistive element;
    while the first FET is closed:
      apply a test load across the positive and negative terminals; and
      obtain a first voltage measurement at a test point in the battery pack;
    provide a second control signal to the first FET causing the first FET to be open;
    while the first FET is open:
      apply the test load across the positive and negative terminals; and
      obtain a second voltage measurement at the test point;
    determine whether a voltage difference between the first voltage measurement and the second voltage measurement is indicative of an open circuit fault condition in the battery pack; and
    determine a location of the open circuit fault condition dependent on a magnitude of the voltage difference between the first voltage measurement and the second voltage measurement in response to a determination that the voltage difference between the first voltage measurement and the second voltage measurement is indicative of the open circuit fault condition in the battery pack.

16. The portable electronic device of claim 15, wherein:
the battery pack further comprises a second FET electrically connected in parallel with a second resistive element, the second resistive element being in series with the second battery cell in the second cell path; and
the test circuit is further configured to:
  while the first FET is open, provide a third control signal to the second FET causing the second FET to be closed; and
  subsequent to determining whether the voltage difference between the first voltage measurement and the second voltage measurement is indicative of an open circuit fault condition in the battery pack:
    provide a fourth control signal to the first FET causing the first FET to be closed;
    provide a fifth control signal to the second FET causing the second FET to be open;
    while the second FET is open:
      apply the test load across the positive and negative terminals; and
      obtain a third voltage measurement at the test point; and
    determine whether a difference between the first voltage measurement and the third voltage measurement is indicative of an open circuit fault condition in the battery pack.

17. The portable electronic device of claim 15, wherein the test point comprises a location in the portable electronic device at which an output voltage for the battery pack or a derivative of the output voltage for the battery pack is measurable.

18. The portable electronic device of claim 15, wherein the test circuit is implemented in the battery pack, in an element of the portable electronic device other than the battery pack, or in a charger electrically connected to the portable electronic device.

* * * * *